(12) United States Patent
Kim et al.

(10) Patent No.: US 12,382,797 B2
(45) Date of Patent: Aug. 5, 2025

(54) DISPLAY PANEL AND DISPLAY APPARATUS INCLUDING THE SAME

(71) Applicant: SAMSUNG DISPLAY CO., LTD., Yongin-si (KR)

(72) Inventors: Hyunjung Kim, Yongin-si (KR); Guanghai Jin, Yongin-si (KR); Yunmi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 590 days.

(21) Appl. No.: 17/658,861

(22) Filed: Apr. 12, 2022

(65) Prior Publication Data
US 2022/0359480 A1 Nov. 10, 2022

(30) Foreign Application Priority Data
May 7, 2021 (KR) ........................ 10-2021-0059506

(51) Int. Cl.
*H01L 21/78* (2006.01)
*H01L 23/00* (2006.01)
(Continued)

(52) U.S. Cl.
CPC ........... *H10K 59/131* (2023.02); *H01L 24/05* (2013.01); *H01L 24/08* (2013.01); *H01L 25/167* (2013.01); *H01L 2224/0557* (2013.01); *H01L 2224/05573* (2013.01); *H01L 2224/05624* (2013.01); *H01L 2224/05647* (2013.01); *H01L 2224/05666* (2013.01); *H01L 2224/0568* (2013.01);
(Continued)

(58) Field of Classification Search
CPC ....... H01L 25/167; H01L 24/05; H01L 24/08; H01L 2224/0557; H01L 2224/05573; H01L 2224/05624; H01L 2224/05647; H01L 2224/05666; H01L 2224/0568; H01L 2224/08146; H01L 2224/08148; H01L 27/124; H01L 27/156; H10K 59/131; H10K 59/121; H10K 59/127; H10K 59/123
USPC ........................................ 257/535
See application file for complete search history.

(56) References Cited

U.S. PATENT DOCUMENTS 7,468,357 B2 * 12/2008 Schinazi ................... A61P 1/16
514/47
10,325,894 B1 * 6/2019 Pan ........................ H01L 25/167
(Continued)

FOREIGN PATENT DOCUMENTS

KR 10-2017-0113066 10/2017
KR 10-2019-0030798 3/2019

*Primary Examiner* — Vu A Vu
(74) *Attorney, Agent, or Firm* — F. CHAU & ASSOCIATES, LLC

(57) ABSTRACT

A display panel includes a substrate having a first surface and a second surface opposite to the first surface, a first pixel circuit arranged on the first surface of the substrate, a first through electrode passing through the substrate and being connected to the first pixel circuit, a first pad electrode arranged on the second surface of the substrate and being connected to the first through electrode, a common electrode arranged on the first surface of the substrate and arranged on the first pixel circuit, a second through electrode passing through the substrate and being connected to the common electrode, and a second pad electrode arranged on the second surface of the substrate and being connected to the second through electrode.

19 Claims, 15 Drawing Sheets

(51) Int. Cl.
  *H01L 25/16* (2023.01)
  *H10K 59/131* (2023.01)
(52) U.S. Cl.
  CPC ............... *H01L 2224/08146* (2013.01); *H01L 2224/08148* (2013.01)

(56) References Cited

U.S. PATENT DOCUMENTS

| | | | |
|---|---|---|---|
| 10,381,381 | B1 | 8/2019 | Choi et al. |
| 10,658,346 | B2 * | 5/2020 | Chong ................ H01L 25/0756 |
| 10,672,847 | B2 * | 6/2020 | Nam ........................ G06F 3/044 |
| 10,720,558 | B2 * | 7/2020 | Moon .................. H01L 25/0753 |
| 10,733,931 | B2 | 8/2020 | Jung et al. |
| 10,868,089 | B2 | 12/2020 | Oh et al. |
| 10,930,631 | B2 * | 2/2021 | Tseng .................. G02F 1/13394 |
| 2003/0168969 | A1 | 9/2003 | Tanabe |
| 2012/0025700 | A1 | 2/2012 | Ryu et al. |
| 2013/0300968 | A1 * | 11/2013 | Okajima ............... H01L 27/124 |
| | | | 257/66 |
| 2017/0103926 | A1 | 4/2017 | Aoyagi et al. |
| 2017/0243860 | A1 | 8/2017 | Hong et al. |
| 2020/0160775 | A1 | 5/2020 | Zhang et al. |
| 2022/0068899 | A1 * | 3/2022 | Lv ....................... H01L 27/1262 |

* cited by examiner

DISPLAY PANEL AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0059506, filed on May 7, 2021, in the Korean Intellectual Property Office, the disclosure of which is incorporated by reference herein in its entirety.

BACKGROUND

1. Field

One or more embodiments relate to a display panel and a display apparatus including the same.

2. Description of the Related Art

Display apparatuses are apparatuses that display data visually. A display apparatus is used as a display for a small product such as a mobile phone, or as a display for a large product such as a television.

Such a display apparatus include a substrate divided into a display area and a non-display area, and the display area includes gate lines and data lines, which are formed to be insulated from each other. A plurality of pixel regions are defined in the display area, and pixels respectively arranged in the plurality of pixel regions receive electrical signals from the gate lines and the data lines crossing each other and emit light to display an image to the outside. A thin-film transistor and a pixel electrode electrically connected to the thin-film transistor may be provided in each pixel region or each of the pixel regions, and a common opposite electrode is provided in the pixel regions. The non-display area may include various wirings that transmit electrical signals to the pixels in the display area, a gate driving unit, and pads to which a data driving unit and a control unit may be connected.

Recently, the usage of display apparatuses has diversified. In addition, the thicknesses and weights of display apparatus have decreased, and thus, the range of use thereof is widening. As display apparatuses are being utilized in various ways, the shape of the display apparatuses may be designed in various ways. Also, functions that may be combined with or linked to display apparatuses have increased.

SUMMARY

One or more embodiments include a display panel having an expanded display area in which an image may be displayed even in a region where a component as an electronic element is arranged, and a display apparatus including the same. However, these objectives are just examples, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate having a first surface and a second surface opposite to the first surface, a first pixel circuit arranged on the first surface of the substrate, a first through electrode passing through the substrate and being connected to the first pixel circuit, a first pad electrode arranged on the second surface of the substrate and being connected to the first through electrode, a plurality of display elements sharing a common electrode arranged on the first surface of the substrate and arranged on the first pixel circuit, a second through electrode passing through the substrate and being connected to the common electrode, and a second pad electrode arranged on the second surface of the substrate and being connected to the second through electrode.

The plurality of display elements include a first display element arranged on the first surface of the substrate and being connected to the first pixel circuit.

The display panel may further include a second pixel circuit arranged on the first surface of the substrate. The plurality of display elements include a second display element arranged on the first surface of the substrate and being connected to the second pixel circuit. A component area and a main area surrounding at least a portion of the component area may be defined in the substrate. The first pixel circuit may be arranged in the component area. The first display element, the first pad electrode, and the second pad electrode may be arranged in the component area. The second pixel circuit and the second display element may be arranged in the main area. The first pixel circuit and the first display element at least partially overlap each other. The second pixel circuit and the second display element at least partially overlap each other.

The display panel may further include a second pixel circuit arranged on the first surface of the substrate. The plurality of display elements include a second display element arranged on the first surface of the substrate and being connected to the second pixel circuit. A component area and a main area surrounding at least a portion of the component area may be defined in the substrate. The first pixel circuit may be arranged in the component area. The first display element, the first pad electrode, and the second pad electrode may be arranged in the component area. The second pixel circuit and the second display element may be arranged in the main area. The first pixel circuit and the second display element may at least partially overlap each other.

The display panel may further include a second pixel circuit arranged on the first surface of the substrate and a second display element arranged on the first surface of the substrate and being connected to the second pixel circuit, and the first pixel circuit may include a first driving transistor controlling a current flowing through the first pad electrode, a first scan transistor transmitting a first data voltage to the first driving transistor in response to a first scan signal, and a first storage capacitor having a first electrode and a second electrode connected to a gate of the first driving transistor, and the second pixel circuit may include a second driving transistor controlling a current flowing through the second display element, a second scan transistor transmitting a second data voltage to the second driving transistor in response to a second scan signal, and a second storage capacitor having a third electrode and a fourth electrode connected to a gate of the second driving transistor.

A ratio of a width of a channel of the first driving transistor with respect to a length of the channel of the first driving transistor may be less than a ratio of a width of a channel of the second driving transistor with respect to a length of the channel of the second driving transistor.

The display panel may further include a connection line extending in a first direction and connecting the first through electrode to the first pixel circuit.

According to one or more embodiments, a display apparatus includes a substrate having a first surface and a second surface opposite to the first surface, a first pixel circuit arranged on the first surface of the substrate, a first through electrode passing through the substrate and being connected to the first pixel circuit, a first pad electrode arranged on the second surface of the substrate and being connected to the first through electrode, and a plurality of display elements including a first display element arranged on the second surface of the substrate and being connected to the first pad electrode.

The plurality of display elements include a common electrode arranged on the first surface of the substrate, and the first display element may be connected to the common electrode.

The display apparatus may further include a second through electrode passing through the substrate and connecting the first display element to the common electrode, and a second pad electrode arranged on the second surface of the substrate and being connected to the second through electrode, and the first display element may include a first conductive pad electrode connected to the first pad electrode and a second conductive pad electrode connected to the second pad electrode.

The plurality of display elements include a second display element arranged on the first surface of the substrate and being connected to the first pixel circuit.

An emission layer of the first display element may include an inorganic material, and an emission layer of the second display element may include an organic material.

An emission area of the first display element may be less than an emission area of the second display element.

The first display element and the second display element may be alternately and repetitively arranged in a first direction.

The display apparatus may further include a second pixel circuit arranged on the first surface of the substrate. The plurality of display elements include a second display element arranged on the first surface of the substrate and being connected to the second pixel circuit, and the first pixel circuit may include a first driving transistor configured to control a current flowing through the first display element, a first scan transistor configured to transmit a first data voltage to the first driving transistor in response to a first scan signal, and a first storage capacitor having a first electrode and a second electrode connected to a gate of the first driving transistor, and the second pixel circuit may include a second driving transistor configured to control a current flowing through the second display element, a second scan transistor configured to transmit a second data voltage to the second driving transistor in response to a second scan signal, and a second storage capacitor having a third electrode and a fourth electrode connected to a gate of the second driving transistor.

A ratio of a width of a channel of the first driving transistor with respect to a length of the channel of the first driving transistor may be less than a ratio of a width of a channel of the second driving transistor with respect to a length of the channel of the second driving transistor.

An emission layer of the first display element may include an inorganic material, and an emission layer of the second display element may include an organic material.

An emission area of the first display element may be less than an emission area of the second display element.

When the display apparatus is viewed in a plan view, the first display element and the first pixel circuit may be spaced apart from each other.

The display apparatus may further include a component arranged on the second surface of the substrate, and the first display element may be arranged between the substrate and the component.

Other aspects, features, and advantages than the above-described aspects, features, and advantages will be apparent from a detailed description of the present disclosure, the claims, and the drawings.

These general and specific aspects may be practiced using systems, methods, computer programs, or any combination of systems, methods, and computer programs.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
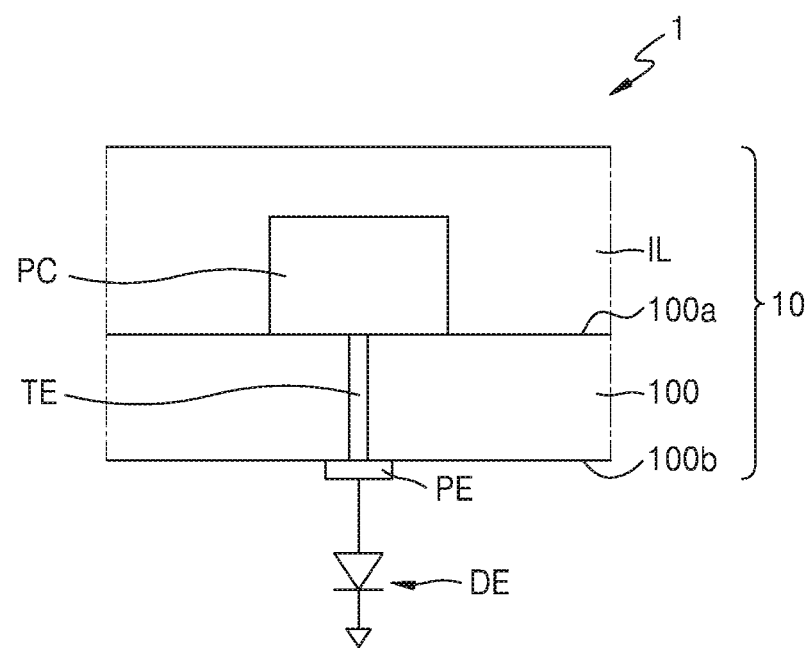
FIG. 1 is a cross-sectional view illustrating a display apparatus according to an embodiment of the present inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described below in more detail with reference to the accompanying drawings. Those components that are the same or are in correspondence are rendered the same reference numeral regardless of the figure number, and a redundant description therewith is omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" refers to A, B, or A and B. And "at least one of A and B" refers to A, B, or A and B.

It will be understood that when a layer, region, or component is referred to as being "connected to," another layer, region, or component, it may be directly or indirectly connected to the other layer, region, or component. That is, for example, intervening layers, regions, or components may be present. It will be understood that when a layer, region, or component is referred to as being "electrically connected to," another layer, region, or component, it may be directly or indirectly electrically connected to the other layer, region, or component. That is, for example, intervening layers, regions, or components may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a cross-sectional view illustrating a display apparatus according to an embodiment.

Referring to FIG. 1, a display apparatus 1 may include a display panel 10 and a display element DE.

The display panel 10 may include a substrate 100, a pixel circuit PC, an insulating layer IL, a through electrode TE, and a pad electrode PE.

The substrate 100 may have a first surface 100$a$ and a second surface 100$b$ facing or opposite to the first surface 100$a$. The substrate 100 may include or may be formed of an insulating material such as glass, quartz, and polymer resin. The substrate 100 may be a rigid substrate or a flexible substrate capable of bending, folding, rolling, or the like.

Figure 3:
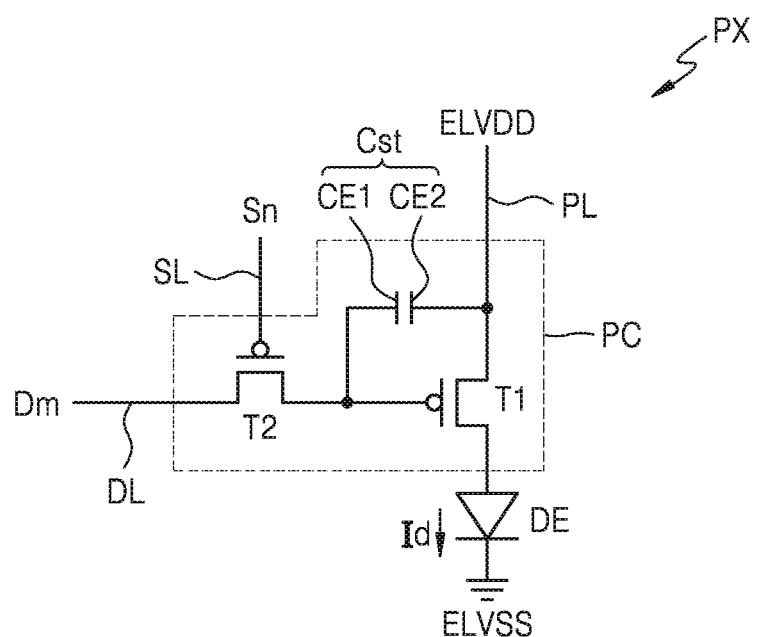
FIG. 3 is an equivalent circuit diagram illustrating a pixel circuit that may be applied to a display panel according to an embodiment of the present inventive concept.

The pixel circuit PC may be arranged on the first surface 100$a$ of the substrate 100. The pixel circuit PC may include at least one transistor and a storage capacitor, as shown in FIG. 3 to be described later. For example, the pixel circuit PC may include a driving transistor that controls a current flowing through the display element DE.

The insulating layer IL may be arranged on the pixel circuit PC. The insulating layer IL may include or may be formed of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). In an example, the insulating layer IL may include or may be formed of an organic material. For example, the insulating layer IL may include or may be formed of benzocyclobutene (BCB), polyimide, hexamethyldisiloxane (HMDSO), a general-purpose polymer such as polymethylmethacrylate (PMMA) and polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof.

In FIG. 1, the insulating layer IL is arranged on the pixel circuit PC. However, in an embodiment, the insulating layer IL may be arranged within the pixel circuit PC.

The through electrode TE may pass through the substrate 100 to be connected to the pixel circuit PC. The through electrode TE may include or may be formed of a conductive material including molybdenum (Mo), aluminum (Al), copper (Cu), titanium (Ti), and the like, and may be formed as a multi-layer or a single layer including the above-described materials. In an example, the through electrode TE may be a multi-layer structure of Ti/Al/Ti.

The pad electrode PE may be arranged on the second surface 100b of the substrate 100. The pad electrode PE may be connected to the through electrode TE. The pad electrode PE may be connected to the pixel circuit PC through the through electrode TE. The pad electrode PE may include or may be formed of a conductive material including Mo, Al, Cu, or Ti, and may be formed as a multi-layer or a single layer including the above-described materials. In an example, the pad electrode PE may be a multi-layer structure of Ti/Al/Ti.

The through electrode TE and the pad electrode PE may be integrated with each other. At least a portion of the pad electrode PE may be buried in a hole formed in the substrate 100, and at least a portion of the pad electrode PE buried in the hole may be referred to as the through electrode TE.

The display element DE may be arranged on the second surface 100b of the substrate 100. The substrate 100 may be arranged between the display element DE and the pixel circuit PC.

The display element DE may include an emission layer, and the emission layer may include or may be formed of an inorganic material or an organic material. The display element DE may be an inorganic light emitting diode (LED) (or a micro LED, m-LED) or an organic light emitting diode (OLED).

The display element DE may be connected to the pad electrode PE. An anode of the display element DE may be connected to the pad electrode PE. The pixel element DE may be connected to the pixel circuit PC through the pad electrode PE and the through electrode TE. The display element DE may be driven by the pixel circuit PC.

Although not shown in FIG. 1, a certain voltage may be applied to a cathode of the display element DE. For example, a second driving voltage ELVSS shown in FIG. 3 to be described later may be applied to the cathode of the display element DE. The cathode of the display element DE may be a common electrode to which the second driving voltage ELVSS is applied. The cathode may be shared by a plurality of display elements.

Figure 2:
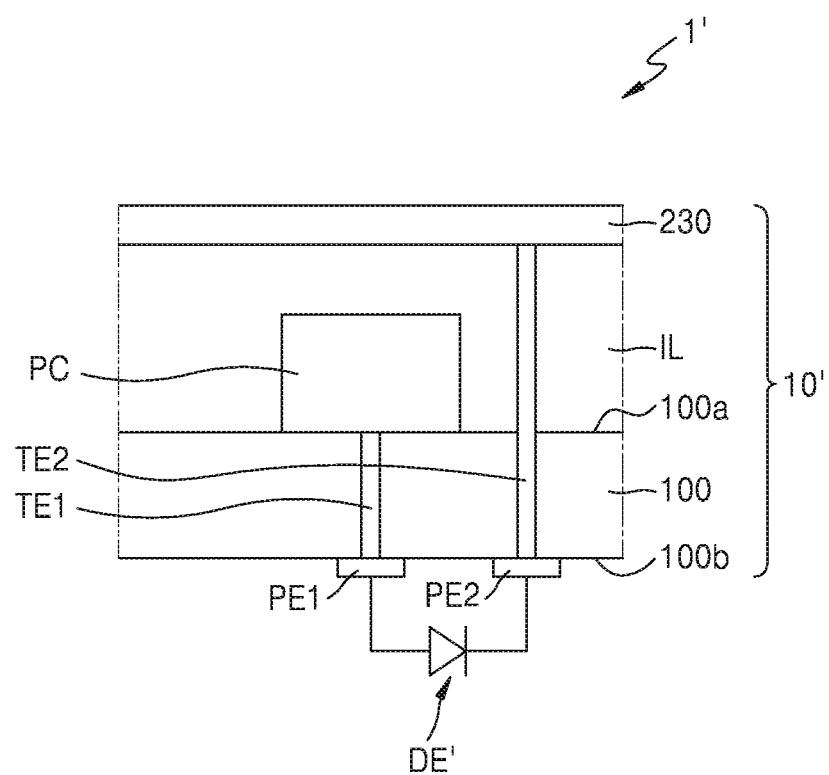
FIG. 2 is a cross-sectional view illustrating a display apparatus according to an embodiment of the present inventive concept.

FIG. 2 is a cross-sectional view schematically illustrating a display apparatus according to an embodiment.

Referring to FIG. 2, a display apparatus 1' may include a display panel 10' and a display element DE'.

The display panel 10' may include a substrate 100, a pixel circuit PC, an insulating layer IL, an opposite electrode 230 (i.e., a common electrode), a first through electrode TE1, a second through electrode TE2, a first pad electrode PE1, and a second pad electrode PE2.

The substrate 100 may have a first surface 100a and a second surface 100b facing or opposite to the first surface 100a. The pixel circuit PC may be arranged on the first surface 100a of the substrate 100. The insulating layer IL may be arranged on the pixel circuit PC.

The opposite electrode 230 may be arranged on the insulating layer IL. The opposite electrode 230 may be a light-transmitting electrode or reflective electrode. In some embodiments, the opposite electrode 230 may be a transparent electrode or a semi-transparent electrode, and may be formed as a thin metal layer having a small work function including lithium (Li), calcium (Ca), lithium fluoride (LiF)/Ca, LiF/Al, Al, silver (Ag), magnesium (Mg), or a compound thereof. A transparent conductive oxide (TCO) layer such as ITO, IZO, ZnO, and $In_2O_3$, may be arranged on the thin metal layer.

The first through electrode TE1 may pass through the substrate 100 to be connected to the pixel circuit PC. The second through electrode TE2 may pass through the substrate 100 to be connected to the opposite electrode 230. The first through electrode TE1 and the second through electrode TE2 may include or may be formed of a conductive material including Mo, Al, Cu, or Ti, and may be formed as a multi-layer or a single layer including the above-described materials. In an example, the first through electrode TE1 and the second through electrode TE2 may have a multi-layer structure of Ti/Al/Ti.

The first pad electrode PE1 and the second pad electrode PE2 may be arranged on the second surface 100b of the substrate 100. The first pad electrode PE1 may be connected to the first through electrode TE1, and the second pad electrode PE2 may be connected to the second through electrode TE2. The first pad electrode PE1 may be connected to the pixel circuit PC via the first through electrode TE1, and the second pad electrode PE2 may be connected to the opposite electrode 230 via the second through electrode TE2.

The first pad electrode PE1 and the second pad electrode PE2 may include or may be formed of a conductive material including Mo, Al, Cu, or Ti, and may be formed as a multi-layer or a single layer including the above-described materials. In an example, the first pad electrode PE1 and the second pad electrode PE2 may have a single layer structure of Ti/Al/Ti.

The first through electrode TE1 and the first pad electrode PE1 may be integrated with each other. At least a portion of the first pad electrode PE1 may be buried in a hold formed in the substrate 100, and at least a portion of the first pad electrode PE1 buried in the hole may be referred to the first through electrode TE1.

The second through electrode TE2 and the second pad electrode PE2 may be integrated with each other. At least a portion of the second pad electrode PE2 may be buried in the hole formed in the substrate 100, and at least a portion of the second pad electrode PE2 buried in the hole may be referred to as the second through electrode TE2.

The display element DE' may be arranged on the second surface 100b of the substrate 100. The substrate 100 may be arranged between the display element DE' and the pixel circuit PC. The display element DE' may include an emission layer, and the emission layer may include or may be formed of an inorganic material or an organic material. The display element DE' may be an inorganic LED (or micro LED, m-LED) or an organic LED.

One end of the display element DE' may be connected to the first pad electrode PE1, and the other end of the display element DE' may be connected to the second pad electrode PE2. An anode of the display element DE' may be connected to the first pad electrode PE1, and a cathode of the display element DE' may be connected to the second pad electrode PE2.

One end (or anode) of the display element DE' may be connected to the pixel circuit PC via the first pad electrode PE1 and the first through electrode TE1, and the other end (or cathode) of the display element DE' may be connected to the opposite electrode 230 via the second pad electrode PE2 and the second through electrode TE2.

FIG. 3 is an equivalent circuit diagram illustrating a pixel that may be applied to a display panel according to an embodiment.

Referring to FIG. 3, the pixel PX may include a pixel circuit PC connected to a scan line SL and a data line DL, and a display element DE connected to the pixel circuit PC. A cathode of the display element DE may be a common electrode to which a second driving voltage ELVSS is applied. The pixel circuit PC of FIG. 3 may correspond to the pixel circuit PC of FIGS. 1 and 2, and the display element DE of FIG. 3 may correspond to the display element DE of FIG. 1 and the display element DE' of FIG. 2.

The pixel circuit PC may include a first transistor T1, a second transistor T2, and a storage capacitor Cst.

The first transistor T1 may be a driving transistor in which the magnitude of a drain current is determined according to a gate-source voltage, and the second transistor T2 may be a switching transistor that is substantially turned on/off according to the gate voltage. The first transistor T1 and the second transistor T2 may be formed as a thin-film transistor.

The first transistor T1 may be referred to as a driving transistor, and the second transistor T2 may be referred to as a scan transistor.

The storage capacitor Cst may be connected to a power line PL and a gate of the driving transistor T1. The storage capacitor Cst may have a second electrode CE2 connected to the power line PL, and a first electrode CE1 connected to the gate of the driving transistor T1. The storage capacitor Cst may store a voltage corresponding to a difference between the voltage transmitted from the scan transistor T2 and a first driving voltage ELVDD supplied to the power line PL.

The driving transistor T1 may control the magnitude of a driving current Id flowing through the display element DE from the power line PL according to a gate-source voltage. The display element DE may emit light having certain luminance by the driving current Id. The driving transistor T1 may have the gate connected to the first electrode CE1 of the storage capacitor Cst, a source connected to the power line PL, and a drain connected to the display element DE.

The scan transistor T2 may transmit a data voltage Dm to the gate of the driving transistor T1 in response to a scan signal Sn. The scan transistor T2 may have a gate connected to the scan line SL, a source connected to the data line DL, and a drain connected to the gate of the driving transistor T1.

In FIG. 3, the pixel circuit PC includes two transistors and one storage capacitor. However, embodiments are not limited thereto. For example, the pixel circuit PC may include three or more transistors and/or two or more storage capacitors. In an embodiment, the pixel circuit PC may include seven transistors and one storage capacitor.

Figure 4:
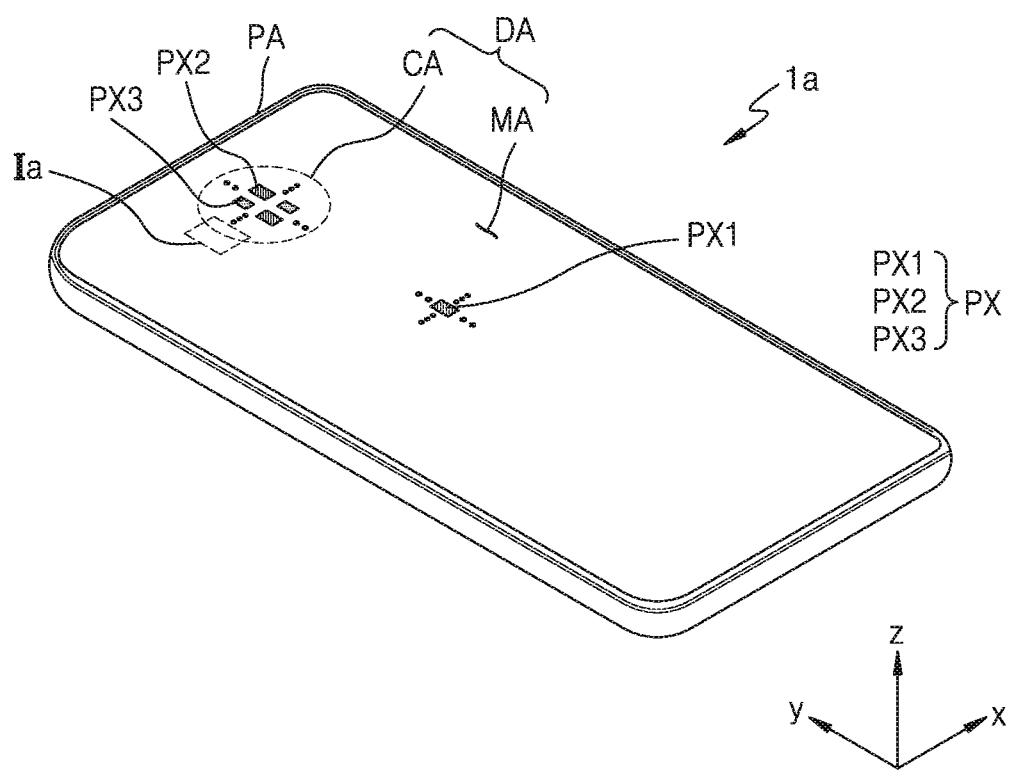
FIG. 4 is a perspective view illustrating an application example of a display apparatus according to an embodiment of the present inventive concept.

FIG. 4 is a perspective view illustrating an application example of a display apparatus according to an embodiment.

Referring to FIG. 4, a display apparatus 1a may include a display area DA and a peripheral area PA outside the display area DA. The display area DA may include a component area CA, and a main area MA at least partially surrounding the component area CA. Each of the component area CA and the main area MA may display an image individually or together. The peripheral area PA may be a kind of non-display area in which display elements are not arranged. The display area DA may be entirely surrounded by the peripheral area PA.

FIG. 4 illustrates that one component area CA is within the main area MA. In an embodiment, a display apparatus 1a may have two or more component areas, and the shapes and sizes of the plurality of component areas CA may be different from each other. When viewed from a direction approximately perpendicular to a top surface of the display apparatus 1a, the shape of the component area CA may be various shapes including a circle, an ellipse, or a polygonal shape such as a quadrangle, a star shape, and a diamond shape. In FIG. 4, when viewed from the direction approximately perpendicular to the top surface of the display apparatus 1a, the component areas CA are arranged in the upper center (+y-direction) of the main area MA having approximately a rectangular shape. However, the component areas CA may be arranged on one side, for example, a right upper side or a left upper side of the main area MA having a rectangular shape.

The display apparatus 1a may provide an image by using a plurality of pixels PX arranged in the display area DA. The display apparatus 1a may provide an image by using a plurality of first pixels PX1 arranged in the main area MA, and a plurality of second pixels PX2 and a plurality of third pixels PX3, which are arranged in the component areas CA.

Each of the plurality of first pixels PX1, the plurality of second pixels PX2, and the plurality of third pixels PX3 may have a display element. Each pixel PX may emit, for example, red, green, blue, or white light through the display element. Each pixel PX may mean a sub-pixel that emits different colors, and each pixel PX may be one of a red sub-pixel, a green sub-pixel, and a blue sub-pixel, for example.

In an embodiment, the third pixels PX3 may have the structure of a display apparatus 1 or 1' shown in FIG. 1 or 2 described above. For example, the display element of the third pixels PX3 may be arranged below the display panel and may be connected to a pixel circuit through a through electrode that passes through a substrate of the display panel. This will be described in more detail with reference to FIG. 6.

In an embodiment, each of the first pixels PX1, the second pixels PX2, and the third pixels PX3 may have different types of display elements. For example, each of the first pixels PX1 and the second pixels PX2 may include an organic light emitting diode as a display element, and each of the third pixels PX3 may include an inorganic light emitting diode as a display element. For example, an emission layer of a display element of each of the first pixels PX1 and the second pixels PX2 may include or may be formed of an organic material, and an emission layer of a display element of each of the third pixels PX3 may include or may be formed of an inorganic material.

In an embodiment, each of the first pixels PX1, the second pixels PX2, and the third pixels PX3 may have the same type of display elements. For example, each of the first pixels PX1, the second pixels PX2, and the third pixels PX3 may include an organic light emitting diode or an inorganic light emitting diode as a display element.

In an embodiment, the number of second pixels PX2 per unit area may be less than the number of first pixels PX1 per unit area. The number of third pixels PX3 per unit area may be less than the number of first pixels PX1 per unit area.

The number of second pixels PX2 and third pixels PX3 per unit area may be less than the number of first pixels PX1 per unit area. Light and/or sound may pass through an area in the component area CA in which the second pixels PX2 and the third pixels PX3 are not arranged.

Although the number of second pixels PX2 per unit area and the number of third pixels PX3 per unit area are less than the number of first pixels PX1 per unit area, all of the second pixels PX2 and the third pixels PX3 are arranged in the component areas CA, so that a difference between the resolution of an image displayed in the component areas CA and the resolution of an image displayed in the main area MA may be minimized.

In an embodiment, the size of the third pixels PX3 may be smaller than the size of the second pixels PX2. A space in which the third pixels PX3 per unit area are arranged, may be smaller than a space in which the second pixels PX2 per unit area are arranged. In this way, the space in which the third pixels PX3 per unit area are arranged, is small, so that the transmittance of light and/or sound in the component areas CA may be secured.

The second pixels PX2 may include an organic light emitting diode, and the third pixels PX3 may include an inorganic light emitting diode. In this case, even when the third pixels PX3 are smaller than the second pixels PX2, the third pixels PX3 may emit light having the same luminance as that of the second pixels PX2.

In the display apparatus 1a according to an embodiment, when light passes through the component areas CA, light transmittance may be about 10% or higher, more particularly, 40% or higher, 25% or higher, 50% or higher, 85% or higher, or 90% or higher. The term of "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the component areas CA, a component 20 as an electronic element may be arranged below the display panel in correspondence to the component areas CA, as will be described later with reference to FIG. 6. The component 20 may have an image capturing device as a camera using infrared rays or visible light. In an embodiment, the component 20 may be a solar cell, a flash, an illuminance sensor, a proximity sensor, or an iris sensor. In an embodiment, the component 20 may have the function of receiving sound.

Figure 5:
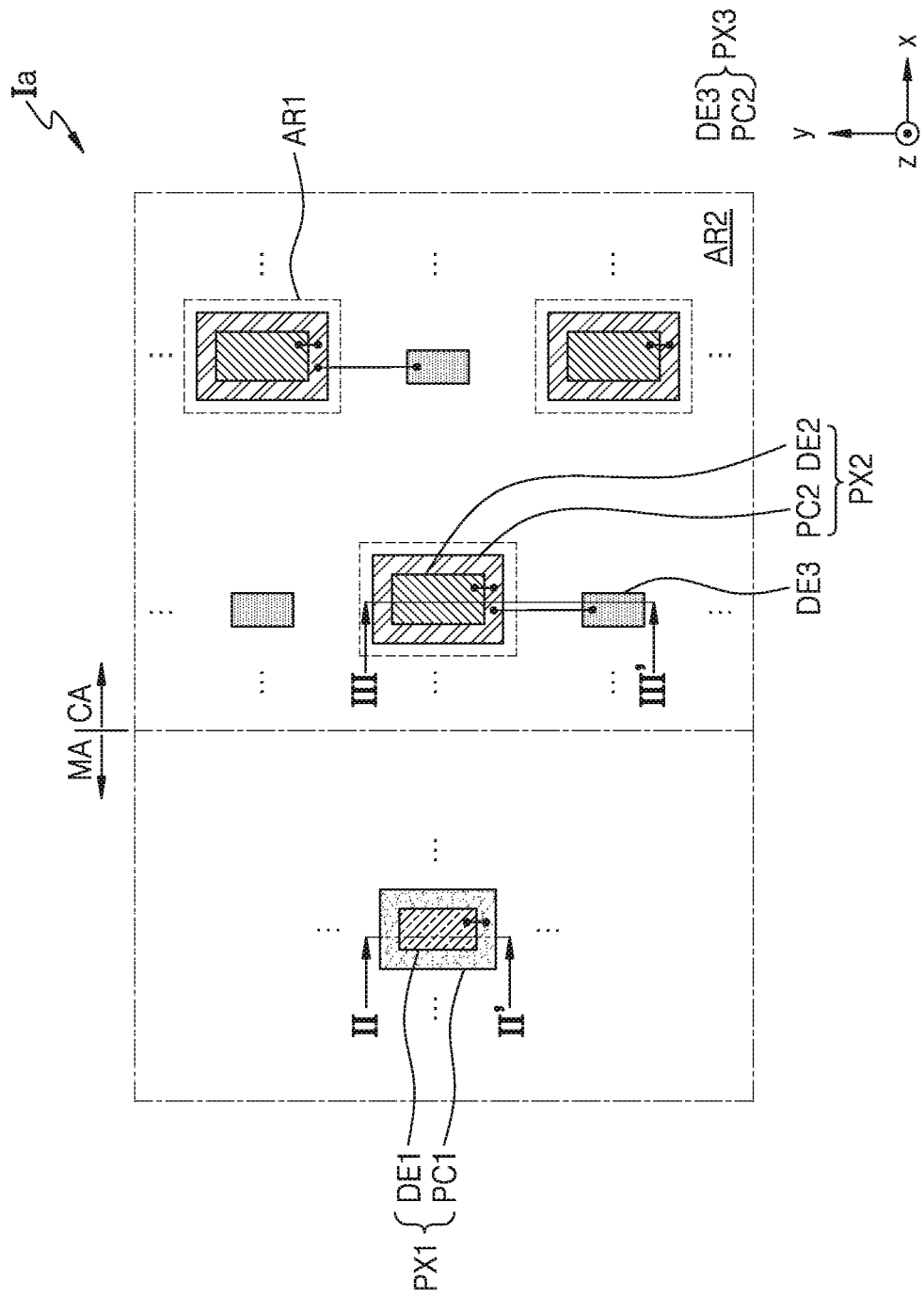
FIG. 5 is an enlarged plan view illustrating some of FIG. 4 according to an embodiment of the present inventive concept.

FIG. 5 is an enlarged plan view illustrating some of FIG. 4.

Referring to FIG. 5, a display apparatus (1a of FIG. 4) may include first pixels PX1 arranged in the main area MA, and second pixels PX2 and third pixels PX3 arranged in the component areas CA.

Each of the first pixels PX1 may include a first pixel circuit PC1 and a first display element DE1, each of the second pixels PX2 may include a second pixel circuit PC2 and a second display element DE2, and each of the third pixels PX3 may include a second pixel circuit PC2 and a third display element DE3. The second pixel PX2 and the third pixel PX3 may share the second pixel circuit PC2.

The first display element DE1 may be driven by the first pixel circuit PC1, and the second display element DE2 and the third display element DE3 may be simultaneously driven by the second pixel circuit PC2.

In FIG. 5, the third display element DE3 is connected to the second pixel circuit PC2 arranged in the same column as the third display element DE3. However, in an embodiment, the third display element DE3 may be connected to the second pixel circuit PC2 arranged in the same row as the third display element DE3.

In FIG. 5, third display elements DE3 are respectively connected to the second pixel circuits PC2. However, in an embodiment, the third display elements DE3 may be respectively connected to the first pixel circuits PC1. In an embodiment, some of the third display elements DE3 may be connected to the first pixel circuits PC1, and the other portion of the third display elements DE3 may be connected to the second pixel circuits PC2.

The first pixel circuit PC1 and the first display element DE1 may at least partially overlap each other, and the second pixel circuit PC2 and the second display element DE2 may at least partially overlap each other. The second pixel circuit PC2 and the third display element DE3 may not overlap each other. For example, on a plane (i.e., when the display panel 10 is viewed in a plan view), the second pixel circuit PC2 and the third display element DE3 may be spaced apart from each other.

In FIG. 5, the planar shape of each of the first pixel circuit PC1, the first display element DE1, the second pixel circuit PC2, the second display element DE2, and the third display element DE3 is a rectangular shape. However, the planar shape of each of the first pixel circuit PC1, the first display element DE1, the second pixel circuit PC2, and the third display element DE3 may be modified in various shapes, such as a circle, an ellipse, or a polygonal shape such as a diamond shape.

In FIG. 5, the second pixel circuits PC2 are arranged in the component areas CA. However, in an embodiment, the second pixel circuits PC2 may be arranged in the main area MA. This will be described later with reference to FIG. 9.

In an embodiment, as shown in FIG. 5, an emission area of the third display element DE3 may be smaller than an emission area of the second display element DE2. An emission area of the first display element DE1 may be smaller than the emission area of the second display element DE2.

The first display elements DE1 may be arranged in a first direction (for example, ±x-direction) and a second direction (for example, ±y-direction). The second display elements DE2 and the third display elements DE3 may be alternately arranged in the first direction (for example, ±x-direction). The second display elements DE2 and the third display elements DE3 may be alternately arranged in the second direction (for example, ±y-direction).

An area in the component area CA where the second display elements DE2 are arranged, may be referred to as a first area AR1, and the other area in the component area CA except for the first area AR1 may be referred to as a second area AR2. Because the second pixel circuit PC2 and the second display elements DE2 may be arranged in the first area AR1 and overlap each other and the third display elements DE3 having a small emission area (or size) are arranged in the second area AR2, average transmittance per unit area of the second area AR2 may be greater than average transmittance per unit area of the first area AR1.

In this way, the third display elements DE3 having a small emission area (or size) may be arranged in the component area CA so that the transmittance of the component area CA may be secured and a difference between the resolution of an image displayed in the component area CA and the resolution of an image displayed in the main area MA may be minimized.

Figure 6:
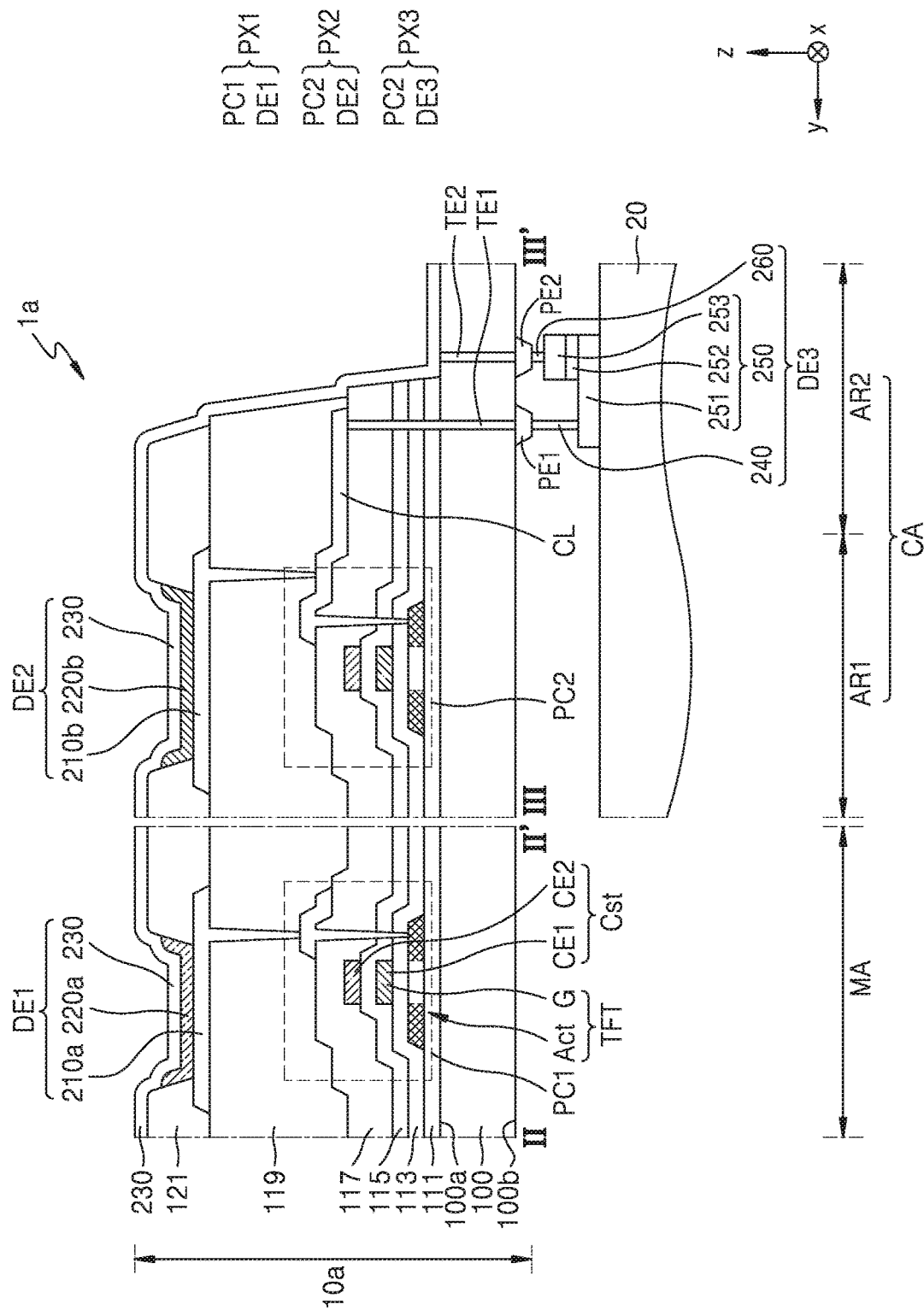
FIG. 6 is an exemplary cross-sectional view of first through third pixels respectively taken along line II-II' and line III-III' of FIG. 5 according to an embodiment of the present inventive concept.

FIG. 6 is an exemplary cross-sectional view of the first through third pixels PX1 through PX3 taken along line II-II' and III-III' of FIG. 5.

Referring to FIG. 6, a display apparatus 1a may include a display panel 10a, a third display element DE3, and a component 20. The component 20 may be arranged below the display panel 10a, and the third display element DE3 may be arranged between the display panel 10a and the component 20.

The display panel 10a may include a first display element DE1 and a first pixel circuit PC1, which are arranged in the main area MA, and a second display element DE2 and a second pixel circuit PC2, which are arranged in the component area CA. The display panel 10a may include a first through electrode TE1, a second through electrode TE2, a first pad electrode PE1, and a second pad electrode PE2, which are arranged in the component area CA.

The first pixel circuit PC1 and the second pixel circuit PC2 may be arranged on the first surface 100a of the substrate 100. The first display element DE1 may be arranged on the first pixel circuit PC1 and may be connected to the first pixel circuit PC1. The second display element DE2 may be arranged on the second pixel circuit PC2 and may be connected to the second pixel circuit PC2. The third display element DE3 may be arranged on the second surface 100b of the substrate 100 and may be connected to the second pixel circuit PC2.

For example, as shown in FIG. 6, the second display element DE2 and the third display element DE3 may be connected to a connection line CL connected to the second pixel circuit PC2. The second pixel circuit PC2 may drive the second display element DE2 and the third display element DE3 simultaneously.

The first pixel circuit PC1 and the second pixel circuit PC2 may include at least one transistor and a storage capacitor, as shown in FIG. 3 described above. For example, the first pixel circuit PC1 may include a first driving transistor that controls a current flowing through the first display element DE1, and the second pixel circuit PC2 may include a second driving transistor that controls a current flowing through the second display element DE2 and the third display element DE3. The at least one transistor may be formed as a thin-film transistor.

The first pixel circuit PC1 and the first display element DE1 may at least partially overlap each other, and the second pixel circuit PC2 and the second display element DE2 may at least partially overlap each other. The second pixel circuit PC2 and the third display element DE3 may not overlap each other.

An emission layer of each of the first display element DE1, the second display element DE2, and the third display element DE3 may include or may be formed of different materials. For example, an emission layer of each of the first display element DE1 and the second display element DE2 may include or may be formed of an organic material, and the emission layer of the third display element DE3 may include or may be formed of an inorganic material.

The first through electrode TE1 may pass through the substrate 100 and may be connected to the second pixel circuit PC2. The through electrode TE1 may be connected to the second pixel circuit PC2 through the connection line CL that extends in the second direction (for example, ±y-direction). The second through electrode TE2 may pass through the substrate 100 and may be connected to the opposite electrode 230.

The first pad electrode PE1 and the second pad electrode PE2 may be arranged on the second surface 100b of the substrate 100. The first pad electrode PE1 may be connected to the first through electrode TE1, and the second pad electrode PE2 may be connected to the second through electrode TE2. The first pad electrode PE1 may be connected to the second pixel circuit PC2 through the first through electrode TE1, and the second pad electrode PE2 may be connected to the opposite electrode 230 through the second through electrode TE2.

The first through electrode TE1 and the first pad electrode PE1 may be integrated with each other. At least a portion of the first pad electrode PE1 may be buried in the hole formed in the substrate 100, and at least a portion of the first pad electrode PE1 buried in the hole may be referred to as the first through electrode TE1. Although the first through electrode TE1 and the first pad electrode PE1 have been described as a reference, such description of the first through electrode TE1 and the first pad electrode PE1 may be applied to the second through electrode TE2 and the second pad electrode PE2.

The third display element DE3 may include a first conductive pad electrode 240, an intermediate layer 250, and a second conductive pad electrode 260. The first conductive pad electrode 240 may be connected to the first pad electrode PE1, and the second conductive pad electrode 260 may be connected to the second pad electrode PE2. Opposite ends of the intermediate layer 250 may be respectively connected to the first conductive pad electrode 240 and the second conductive pad electrode 260.

The intermediate layer 250 may include a first semiconductor layer 251, a second semiconductor layer 253, and an emission layer 252 between the first semiconductor layer 251 and the second semiconductor layer 253.

The first semiconductor layer 251 may be implemented as a p-type semiconductor layer, for example. The p-type semiconductor layer may be selected from a semiconductor material having a formula of $In_xAl_yGa1-x-yN$ ($0 \leq x \leq 1$, $0 \leq y \leq 1$, $0 \leq x+y \leq 1$), for example, GaN, AlN, AlGaN, InGaN, InN, InAlGaN, or AlInN, and a p-type dopant such as magnesium (Mg), zinc (Zn), calcium (Ca), strontium (Sr), and barium (Ba) may be doped into the p-type semiconductor layer. The first semiconductor layer 251 may be connected to the second pixel circuit PC2 through the first conductive pad electrode 240.

The second semiconductor layer 253 may be formed by including an n-type semiconductor layer, for example. The n-type semiconductor layer may be selected from a semiconductor material having a formula of $In_xAl_yGa1-x-yN$ ($0 \leq x \leq 1$, $0 \leq y \leq 1$, $0 \leq x+y \leq 1$), for example, GaN, AlN, AlGaN, InGaN, InN, InAlGaN, or AlInN, and an n-type dopant such as silicon (Si), germanium (Ge), and tin (Sn) may be doped into the n-type semiconductor layer. The second semiconductor layer 253 may be connected to the opposite electrode 230 through the second conductive pad electrode 260. Embodiments are not limited thereto, and in an embodiment, the first semiconductor layer 251 may include or may be formed of an n-type semiconductor layer, and the second semiconductor layer 253 may include or may be formed of a p-type semiconductor layer.

The emission layer 252 may be an area in which electrons and holes are recombined with each other, and as electrons and holes are recombined with each other, the emission layer 252 may transition to a low energy level and may emit light (for example, blue light) having a corresponding wavelength. The emission layer 252 may be formed by including a semiconductor material having a formula of $In_xAl_yGa1-x-yN$ ($0 \leq x \leq 1$, $0 \leq y \leq 1$, $0 \leq x+y \leq 1$), for example, and may have a single quantum well structure or a multi quantum well (MQW) structure. The emission layer 252 may have a quantum wire structure or a quantum dot structure.

In an embodiment, the first conductive pad electrode 240 and the second conductive pad electrode 260 may be arranged in parallel in the second direction (±y-direction). The first pad electrode PE1 and the second pad electrode PE2 respectively connected to the first conductive pad electrode 240 and the second conductive pad electrode 260 may be arranged in parallel in the second direction (±y-direction). The first pad electrode PE1 and the second pad electrode PE2 may be arranged on the same layer. For example, the third display element DE3 may be a horizontal type or flip type emission diode.

In FIG. 6, the first conductive pad electrode 240 and the second conductive pad electrode 260 are arranged in parallel in the second direction (±y-direction). However, in an embodiment, the first conductive pad electrode 240 and the second conductive pad electrode 260 may be positioned at opposite sides of the intermediate layer 250. This will be described later with reference to FIG. 7.

Hereinafter, a configuration included in the display panel 10a will be described according to a stack structure in more detail with reference to FIG. 6.

The substrate 100 may include or may be formed of glass or polymer resin. The polymer resin may include or may be formed of polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable or bendable. The substrate 100 may have a multi-layer structure including a layer including the above-described polymer resin and an inorganic layer (not shown).

The buffer layer 111 may reduce or block penetration of foreign substances, moisture or external air from a lower portion of the substrate 100 and may provide a flat surface to the substrate 100. The buffer layer 111 may include or may be formed of an inorganic material such as oxide and nitride, an organic material, or an organic-inorganic composite material and may be a single layer or a multi-layer of an inorganic material and an organic material.

A barrier layer (not shown) may be further included between the substrate 100 and the buffer layer 111. The barrier layer may prevent or minimize penetration of an impurity from the substrate 100 into an active layer Act. The barrier layer may include or may be formed of an inorganic material such as oxide and nitride, an organic material, or an organic-inorganic composite material and may be a single layer or a multi-layer of an inorganic material and an organic material.

The active layer Act may be arranged on the buffer layer 111. The active layer Act may include or may be formed of amorphous silicon or polysilicon. In an embodiment, the active layer Act may include or may be formed of an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The active layer Act may include a channel region, and a source region and a drain region, which are arranged at opposite sides of the channel region. The active layer Act may be a single layer or a multi-layer.

A first gate insulating layer 113 and a second gate insulating layer 115 may be stacked on the substrate 100 so as to cover the active layer Act. The first gate insulating layer 113 and the second gate insulating layer 115 may include or may be formed of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A gate electrode G may be arranged on the first gate insulating layer 113 so as to overlap at least partially the active layer Act. The gate electrode G may include or may be formed of Mo, Al, Cu, or Ti, and may be a single layer or a multi-layer. In an example, the gate electrode G may be a single layer of Mo.

In FIG. 6, the gate electrode G is arranged on a top surface of a gate insulating layer 113. However, in an embodiment, the gate electrode G may be arranged on the top surface of the gate insulating layer 115.

In an embodiment, the storage capacitor Cst may include a first electrode CE1 and a second electrode CE2, and as shown in FIG. 6, the storage capacitor Cst may overlap a thin-film transistor TFT. For example, the gate electrode G of the thin-film transistor TFT may perform the function of the first electrode CE1 of the storage capacitor Cst. In some embodiments, the storage capacitor Cst may not overlap the thin-film transistor TFT, and the first electrode CE1 and the gate electrode G may be separately present.

The second electrode CE2 of the storage capacitor Cst may overlap the first electrode CE1 with a second gate insulating layer 115 therebetween and may form a capacitance. In this case, the second gate insulating layer 115 may perform the function of a dielectric layer of the storage capacitor Cst.

The second electrode CE2 of the storage capacitor Cst may be arranged on the second gate insulating layer 115. The second electrode CE2 of the storage capacitor Cst may include or may be formed of a conductive material including Mo, Al, Cu, or Ti, and may be a multi-layer or a single layer including the above-described materials.

An intermediate insulating layer 117 may be provided on the second gate insulating layer 115 so as to cover the second electrode CE2 of the storage capacitor Cst. The intermediate insulating layer 117 may include or may be formed of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A source electrode and/or a drain electrode, and a connection line CL may be arranged on an upper portion of the intermediate insulating layer 117.

The source electrode, the drain electrode, and the connection line CL may include or may be formed of a conductive material including Mo, Al, Cu, or Ti, and may be a multi-layer or a single layer including the above-described materials. In an example, the source electrode, the drain electrode, and the connection line CL may have a multi-layer structure of Ti/Al/Ti. The source electrode, the drain electrode, and the connection line CL may be connected to the active layer Act through a contact hole.

The source electrode, the drain electrode, and the connection line CL may be covered by an inorganic protective layer (not shown). The inorganic protective layer may be a single layer or a multi-layer of silicon nitride ($SiN_x$) and silicon oxide ($SiO_x$). The inorganic protective layer may be introduced to cover and protect some wirings arranged on the interlayer insulating layer 117.

In FIG. 6, the connection line CL is arranged on the interlayer insulating layer 117. However, in an embodiment, the connection line CL may be arranged on the buffer layer 111 and may be formed of the same material as that of the active layer Act. In an embodiment, the connection line CL may be arranged on the first gate insulating layer 113 and may be formed of the same material as that of the gate electrode G, or the connection line CL may be arranged on the second gate insulating layer 115 and may be formed of the same material as that of the second electrode CE2.

In an embodiment, the connection line CL may include or may be formed of a transparent conductive material. For example, the connection line CL may include or may be formed of a transparent conducting oxide (TCO). The connection line CL may include or may include a conductive oxide, such as indium tin oxide (ITO), indium zinc oxide (IZO), zinc oxide (ZnO), indium oxide ($In_2O_3$), indium gallium oxide (IGO), and aluminum zinc oxide (AZO).

A planarization layer 119 may be arranged to cover the source electrode, the drain electrode, and the connection line CL. The planarization layer 119 may include contact holes for connecting a first pixel circuit PC1 to a first pixel electrode 210a and for connecting a second pixel circuit PC2 to a second pixel electrode 210b.

The planarization layer 119 may be a single layer or a multi-layer formed of an organic material and may provide a flat top surface. The planarization layer 119 may include or may be formed of benzocyclobutene (BCB), polyimide, hexamethyldisiloxane (HMDSO), a general-purpose polymer such as polymethylmethacrylate (PMMA) and polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof.

A first display element DE1 and a second display element DE2 may be arranged on the planarization layer 119. The first display element DE1 may include a first pixel electrode 210a, a first intermediate layer 220a including an organic emission layer, and an opposite electrode 230, and the second display element DE2 may include a second pixel electrode 210b, a second intermediate layer 220b including an organic emission layer, and an opposite electrode 230. Each of the first display element DE1 and the second display element DE2 may be connected to the first pixel circuit PC1 and the second pixel circuit PC2 through the contact holes formed in the planarization layer 119.

The first pixel electrode 210a may include or may be a transparent electrode, a semi-transparent electrode or a reflective electrode. In some embodiments, the first pixel electrode 210a may include or may be formed of a reflective layer formed of Ag, Mg, Al, Pt, Pd, Au, Ni, Nd, Ir, Cr, or a compound thereof, and a transparent electrode layer or a semi-transparent electrode layer formed on the reflective layer. The transparent electrode layer or the semi-transparent electrode layer may include or may be formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first pixel electrode 210a may be formed of ITO/Ag/ITO. Although the first pixel electrode 210a has been described as a reference, such description of the first pixel electrode 210a may be applied to the second pixel electrode 210b.

In a display area (DA of FIG. 4) of the substrate 100, a pixel defining layer 121 may be arranged on the planarization layer 119. The pixel defining layer 121 may cover the edge of the first pixel electrode 210a and may have an opening for exposing the central part of the first pixel electrode 210a. The pixel defining layer 121 may cover the edge of the second pixel electrode 210b and may have an opening for exposing the central part of the second pixel electrode 210b.

The pixel defining layer 121 may increase a distance between the edge of the first pixel electrode 210a and an upper portion of the first pixel electrode 210a, thereby preventing an arc from occurring at the edge of the first pixel electrode 210a. Although the first pixel electrode 210a has been described as a reference, such description of the first pixel electrode 210a may be applied to the second pixel electrode 210b.

The pixel defining layer 121 may include or may be formed of one or more organic insulating materials selected from the group consisting of polyimide, polyamide, acryl resin, benzocyclobutene, and phenol resin by using a method such as spin coating.

In an embodiment, as shown in FIG. 6, some of insulating layers arranged on the first surface 100a of the substrate 100 may be removed so that a portion of the substrate 100 corresponding to the component area CA may be exposed. As some of the insulating layers corresponding to the component area CA are removed, the transmittance of the component area CA may be enhanced.

Figure 10:
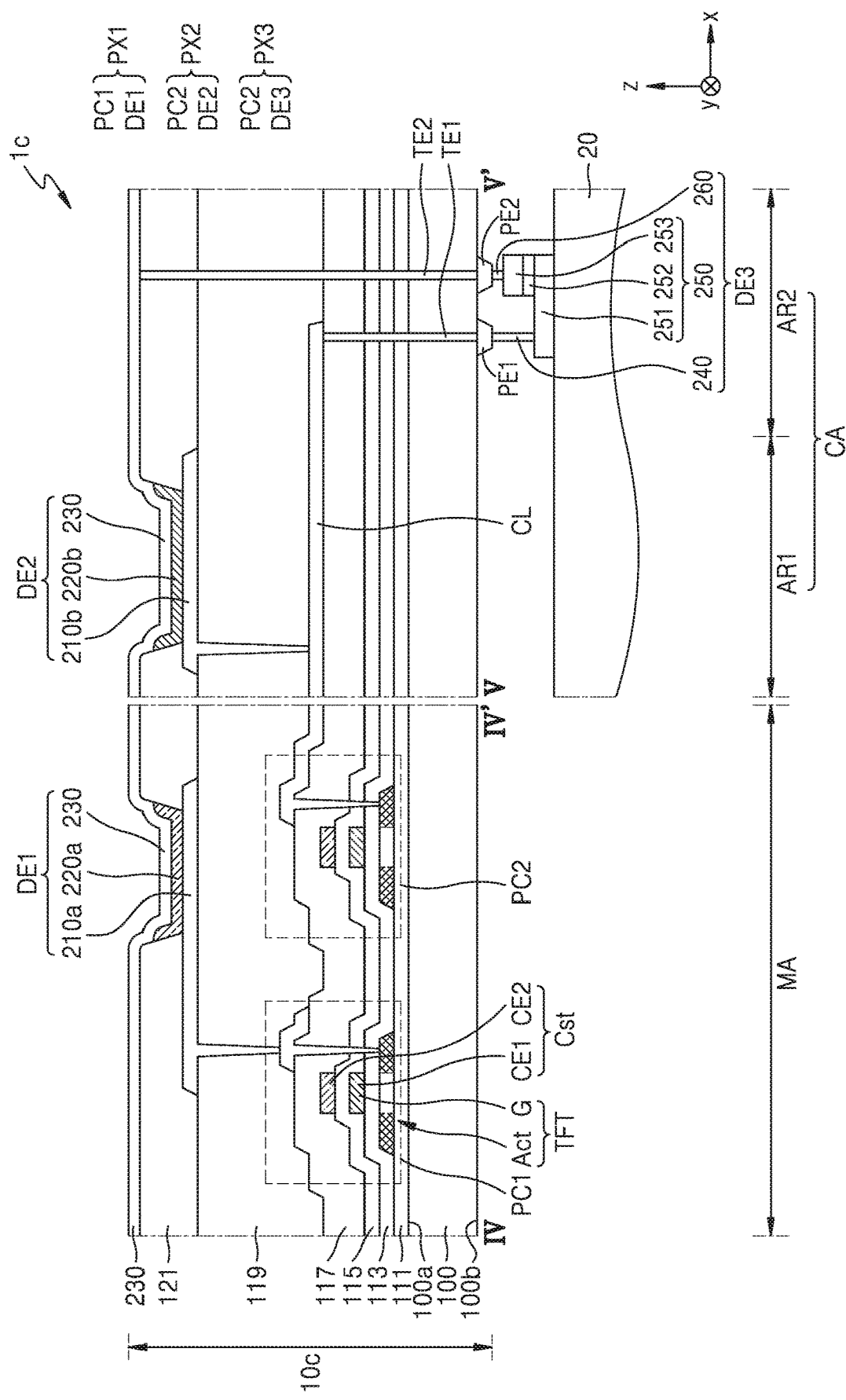
FIG. 10 is an exemplary cross-sectional view of first through third pixels respectively taken along line IV-IV' and line V-V' of FIG. 9 according to an embodiment of the present inventive concept.

In FIG. 6, some of the insulating layers corresponding to the component area CA are removed. However, in an embodiment, at least a portion of the insulating layers may be removed. In an embodiment, as shown in FIG. 10 to be described later, some of the insulating layers may not be removed.

The first intermediate layer 220a may be arranged in the opening formed by the pixel defining layer 121 and may include or may be formed of an organic emission layer. The organic emission layer may include or may be formed of an organic material including a fluorescent or phosphorescent material emitting red, green, blue, or white light. The organic emission layer may be a small molecular weight organic material or polymer material, and a functional layer, such as a hole transport layer (HTL), a hole injection layer (HIL), an electron transport layer (ETL), and an electron injection layer (EIL), may be optically further arranged under and on the organic emission layer. Although the first intermediate layer 220a has been described as a reference, such description of the first intermediate layer 220a may be applied to the second intermediate layer 220b.

The opposite electrode 230 may be a transparent electrode or a reflective electrode. In some embodiments, the opposite electrode 230 may be a transparent electrode or a semi-transparent electrode, and may be formed of a thin metal layer having a small work function including Li, Ca, LiF/Ca, LiF/Al, Al, Ag, Mg, or a compound thereof. A TCO layer, such as ITO, IZO, ZnO, and $In_2O_3$, may be further arranged on the thin metal layer. The opposite electrode 230 may be arranged over the display area DA and may be arranged on the first intermediate layer 220a, the second intermediate layer 220b, and the pixel defining layer 121. The opposite electrode 230 may be integrally formed in a plurality of display elements to correspond to a plurality of pixel electrodes. For example, the plurality of display elements may share the opposite electrode 230 (i.e., a common electrode), and each display element may have a respective pixel electrode.

Because the first display element DE1 and the second display element DE2 including the organic emission layer may be easily damaged by moisture or oxygen from the outside, an encapsulation layer (not shown) may cover and protect the first display element DE1 and the second display element DE2. The encapsulation layer may cover the display area DA and may extend up to at least a portion of a peripheral area (PA of FIG. 4). The encapsulation layer may include a first inorganic encapsulation layer, an organic encapsulation layer, and a second inorganic encapsulation layer.

Figure 7:
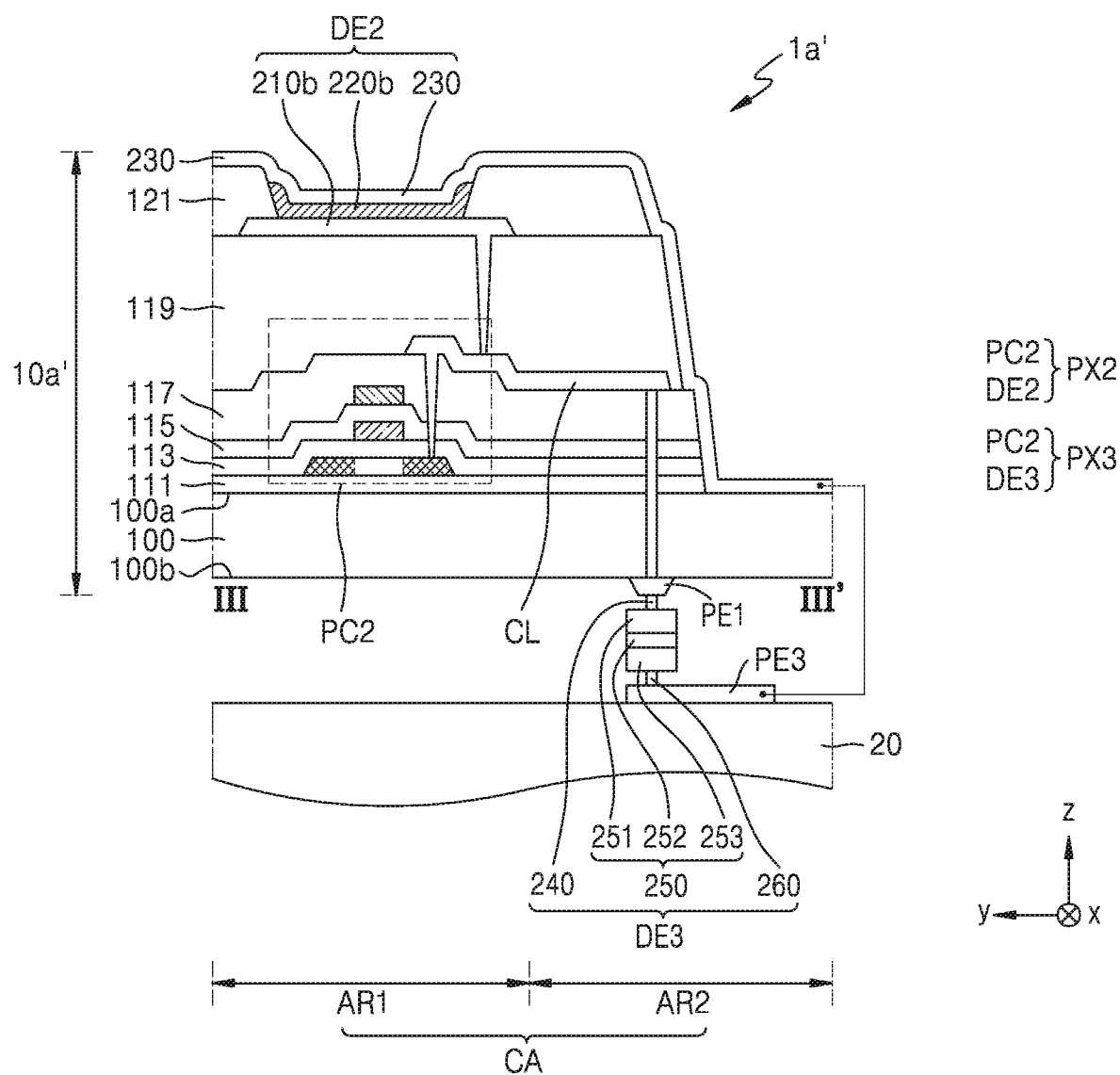
FIG. 7 is an exemplary cross-sectional view of a second pixel and a third pixel taken along line III-III' of FIG. 5 according to an embodiment of the present inventive concept.

FIG. 7 is an exemplary cross-sectional view of a second pixel and a third pixel taken along line III-III' of FIG. 5. FIG. 7 illustrates a modified embodiment of FIG. 6, and there is a difference between FIGS. 6 and 7 in the structure of a third display element. Hereinafter, redundant contents of the description of FIG. 6 may be omitted, and differences will be mainly described.

Referring to FIG. 7, unlike in FIG. 6 described above, the second through electrode TE2 and the second pad electrode PE2 may be omitted. Instead, a third pad electrode PE3 may be arranged on a component 20. The third pad electrode PE3 may be connected to the opposite electrode 230. For example, the third pad electrode PE3 may be connected to the opposite electrode 230 through a through electrode. In some embodiments, the third pad electrode PE3 may be arranged in the peripheral area (PA of FIG. 4) of the display apparatus (1a of FIG. 4) and may be connected to an outer wiring or outer circuit connected to the opposite electrode 230.

The third display element DE3 may include a first conductive pad electrode 240, an intermediate layer 250, and a second conductive pad electrode 260, as described above in FIG. 6. The first conductive pad electrode 240 may be connected to the first pad electrode PE1, and the second conductive pad electrode 260 may be connected to the second pad electrode PE2. The intermediate layer 250 may be arranged between the first conductive pad electrode 240 and the second conductive pad electrode 260. The first conductive pad electrode 240 and the second conductive pad electrode 260 may be positioned at opposite sides based on the intermediate layer 250.

The intermediate layer 250 may include a first semiconductor layer 251, a second semiconductor layer 253, and an emission layer 252 between the first semiconductor layer 251 and the second semiconductor layer 253. The first semiconductor layer 251 may be connected to the second pixel circuit PC2 through the first conductive pad electrode 240 and the first pad electrode PE1, and the second semiconductor layer 253 may be connected to the opposite electrode 230 through the second conductive pad electrode 260 and the third pad electrode PE3.

Figure 8:
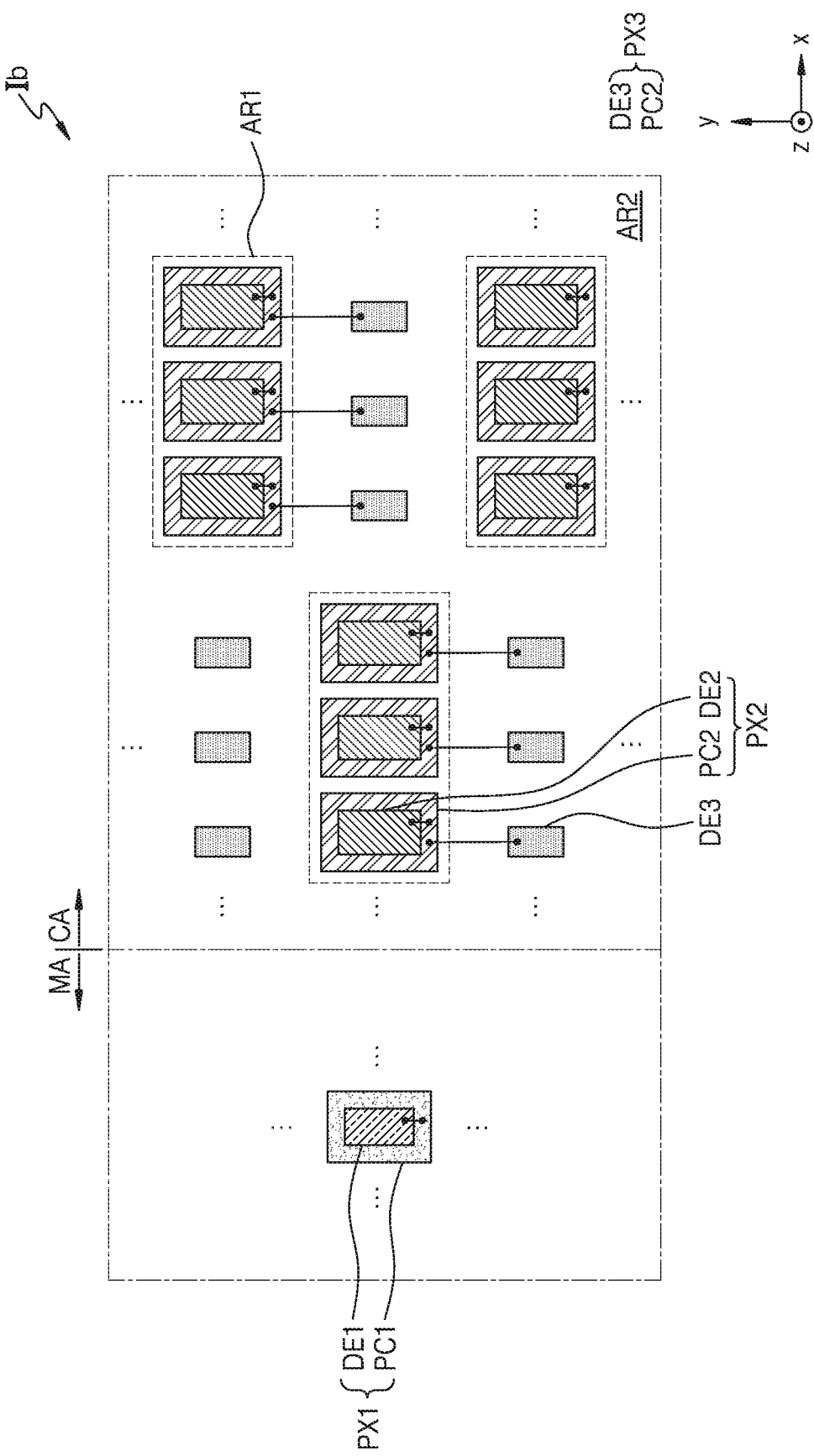
FIG. 8 is an enlarged plan view illustrating some of FIG. 4 according to an embodiment of the present inventive concept.

FIG. 8 is an enlarged plan view illustrating some of FIG. 4.

Referring to FIG. 8, three second pixels PX2 may be arranged in the first area AR1 of the component area CA. Three second pixel circuits PC2 and three second display elements DE2 may be arranged in the first area AR1 of the component area CA. Three third display elements DE3 may be connected to three second pixel circuits PC2, respectively, and may be arranged in the second area AR2 of the component area CA.

Three second pixels PX2 arranged in the first area AR1 may emit red, green, and blue light, respectively, and may be arranged in a stripe structure (i.e., in a stripe pattern). Three third pixels PX3 arranged in the second area AR2 may emit red, green, and blue light, respectively, and may be arranged in a stripe structure.

In FIG. 8, three second pixels PX2 are arranged in the first area AR1. However, in an embodiment, the number of second pixels PX2 arranged in the first area AR1 may vary. Although the second pixel PX2 has been described as a reference, such description of the second pixel PX2 may be applied to the third pixels PX3.

In FIG. 8, second pixels PX2 and third pixels PX3 are arranged in a stripe structure. However, in an embodiment, the second pixels PX2 and/or the third pixels PX3 may be arranged in various shapes, such as a pentile matrix structure (or a pentile structure), a mosaic arrangement structure, and a delta arrangement structure.

The first pixels PX1 arranged in the main area MA may be arranged in various shapes, such as a stripe structure, a pentile matrix structure (or a pentile structure), a mosaic arrangement structure, and a delta arrangement structure.

Figure 9:
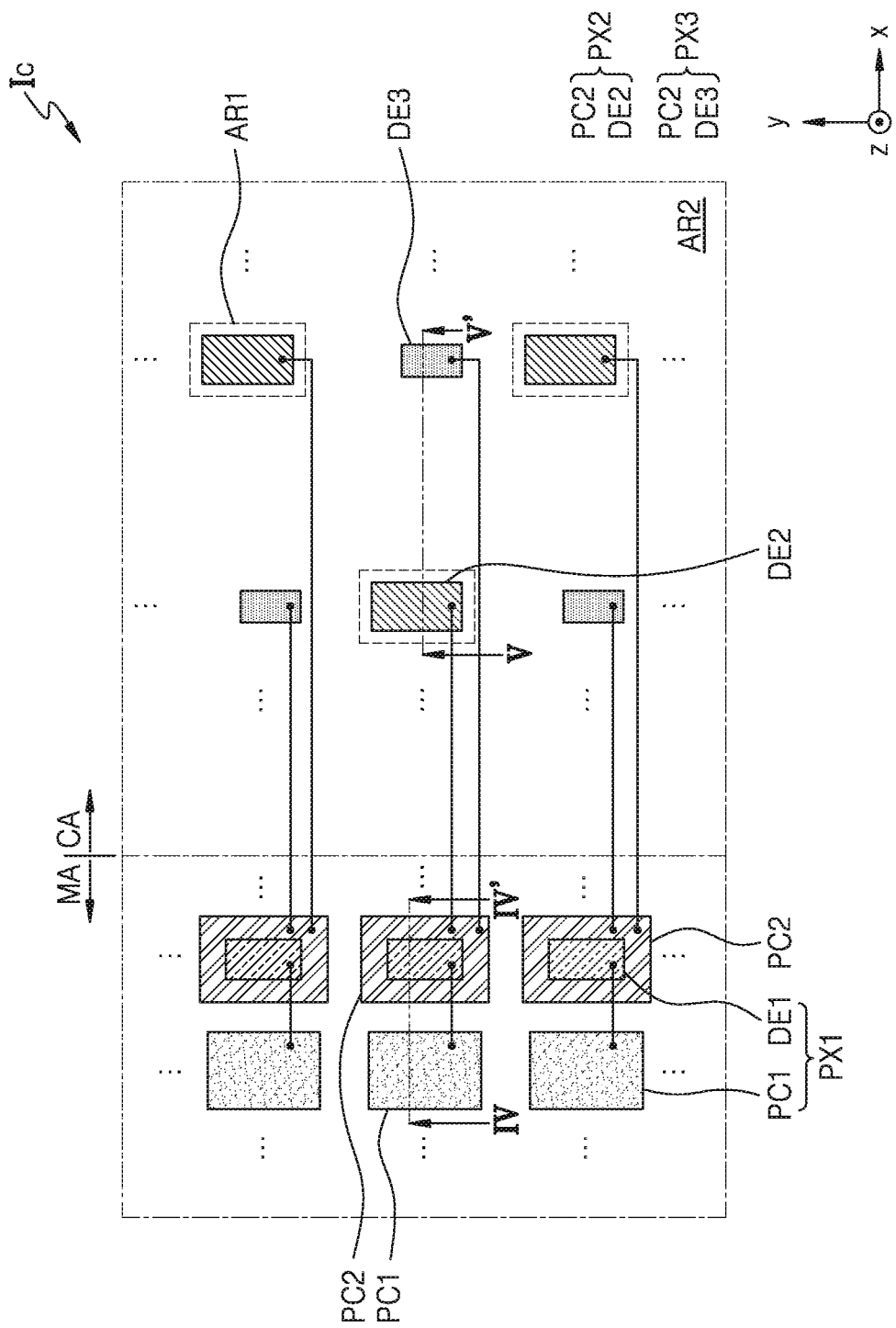
FIG. 9 is an enlarged plan view illustrating some of FIG. 4 according to an embodiment of the present inventive concept.

FIG. 9 is an enlarged plan view illustrating some of FIG. 4, and FIG. 10 is an exemplary cross-sectional view of first through third pixels respectively taken along line IV-IV' and line V-V' of FIG. 9. FIGS. 9 and 10 illustrate a modified embodiment of FIGS. 5 and 6, and there is a difference in the structure of a second pixel circuit. Hereinafter, redundant contents of FIGS. 5 and 6 will be omitted, and differences will be mainly described.

Referring to FIG. 9, unlike in FIG. 5 described above, the second pixel circuit PC2 may be arranged in the main area MA. For example, the second pixel circuit PC2 may be arranged in the main area MA adjacent to a boundary between the main area MA and the component area CA. The second pixel circuit PC2 and the second display element DE2 may not overlap each other, and the second pixel circuit PC2 and the third display element DE3 may not overlap each other.

In an embodiment, the first pixel circuit PC1 and the first display element DE1 may at least partially overlap each other or may not overlap each other according to a position where the first pixel circuit PC1 and the first display element DE1 are arranged in the main area MA. For example, as shown in FIG. 9, the first pixel circuit PC1 adjacent to the second pixel circuit PC2 may not overlap the first display element DE1 connected to the first pixel circuit PC1, and the first display element DE1 may at least partially overlap the second pixel circuit PC2. Although not shown in FIG. 9, the first pixel circuit PC1 that is not adjacent to the second pixel circuit PC2 may at least partially overlap the first display element DE1.

Although not shown in FIG. 9, the area in which the first pixel circuit PC1 and the first display element DE1 overlap each other, may vary according to a separation distance between the first pixel circuit PC1 and the second pixel circuit PC2. When the separation distance between the first pixel circuit PC1 and the second pixel circuit PC2 is relatively large, the area in which the first pixel circuit PC1 and the first display element DE1 overlap each other, may also be relatively large. For example, as the position of the first pixel circuit PC1 is away from the component area CA, the area in which the first pixel circuit PC1 and the first display element DE1 overlap each other, may increase.

Referring to FIG. 10, the second display element DE2 and the third display element DE3 may be connected to the second pixel circuit PC2 through the connection line CL that extends in the first direction (±x-direction).

In FIG. 10, the second display element DE2 and the third display element DE3 are connected to the second pixel circuit PC2 through one connection line CL. However, in an embodiment, each of the second display element DE2 and the third display element DE3 may be connected to the second pixel circuit PC2 through separate connection lines.

Figure 11:
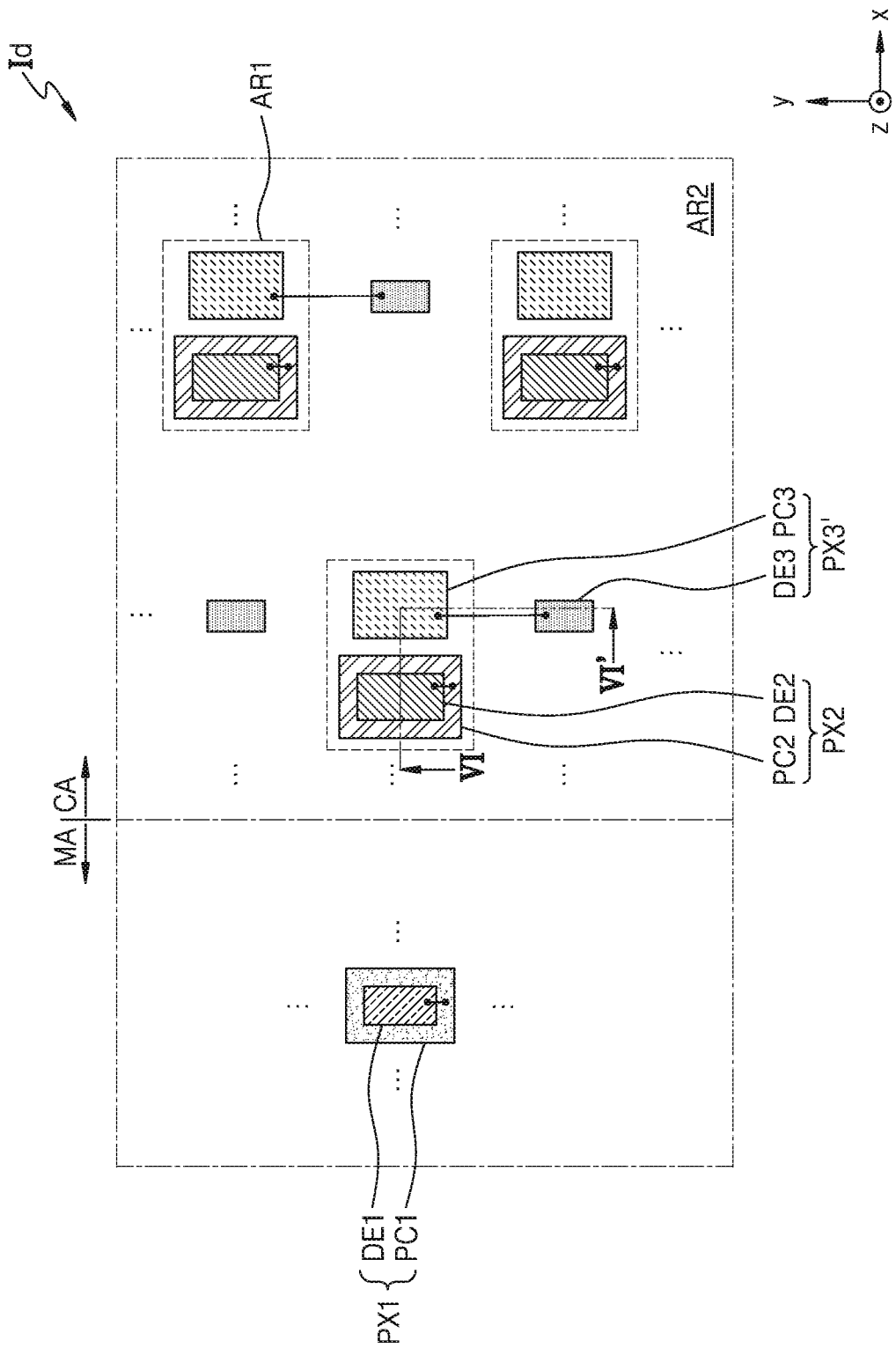
FIG. 11 is an enlarged plan view illustrating some of FIG. 4 according to an embodiment of the present inventive concept.
Figure 12:
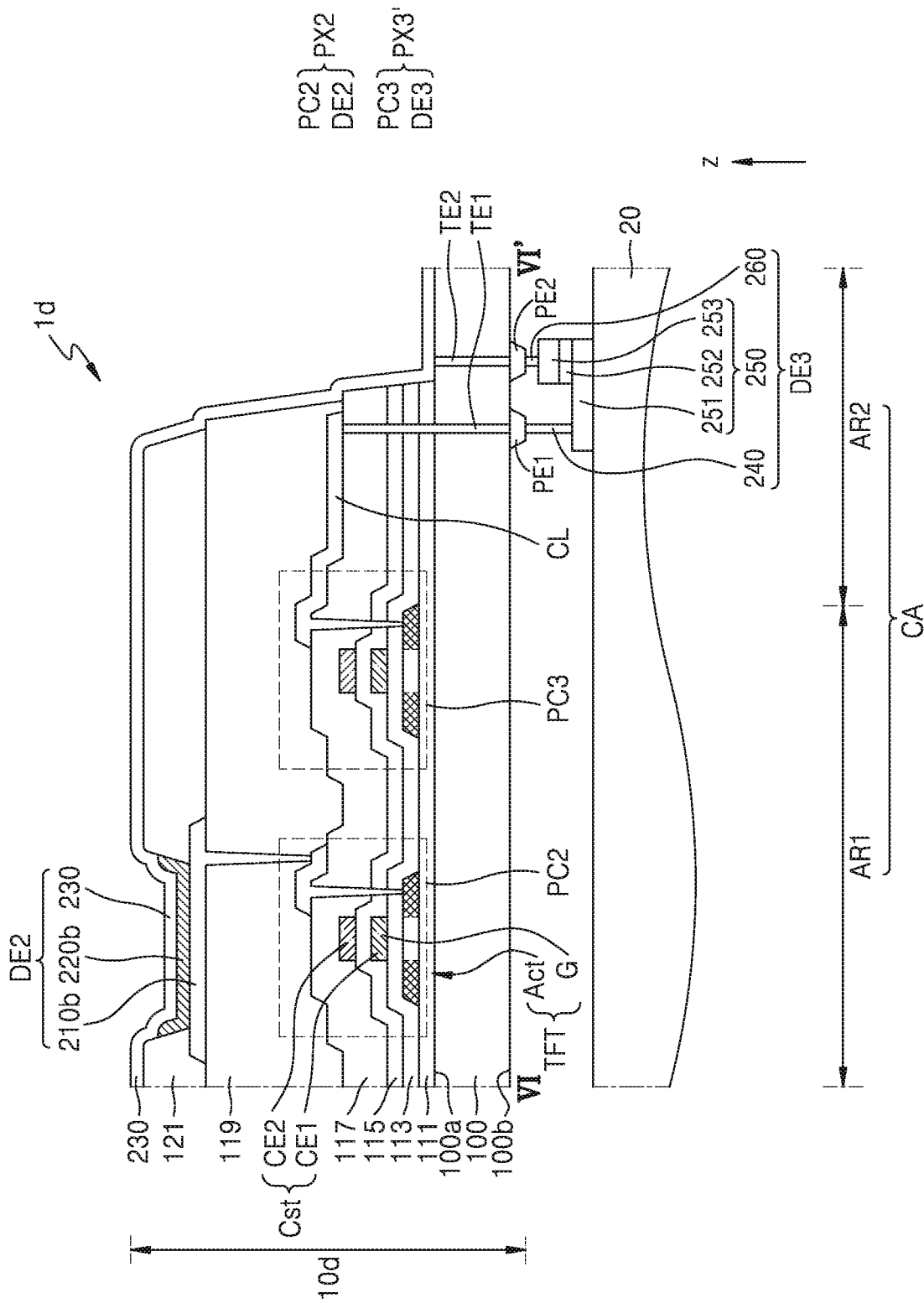
FIG. 12 is an exemplary cross-sectional view of a second pixel and a third pixel taken along line VI-VI' of FIG. 11 according to an embodiment of the present inventive concept.

FIG. 11 is an enlarged plan view illustrating some of FIG. 4, and FIG. 12 is an exemplary cross-sectional view of a second pixel and a third pixel taken along line VI-VI' of FIG. 11. FIGS. 11 and 12 illustrate a modified embodiment of FIGS. 5 and 6, and there is a difference in the structure of a third pixel circuit. Hereinafter, redundant contents of the description of FIGS. 5 and 6 will be omitted, and differences will be mainly described.

Referring to FIG. 11, unlike in FIG. 5, a third pixel PX3' may include a third pixel circuit PC3 and a third display element DE3. Because the third display element DE3 may be driven by the third pixel circuit PC3, the third display element DE3 may be driven independently from the second display element DE2.

In FIG. 11, the third display element DE3 is connected to the third pixel circuit PC3 arranged in the same column as that of the third display element DE3. However, in an embodiment, the third display element DE3 may be connected to the third pixel circuit PC3 arranged in the same row as that of the third display element DE3.

In FIG. 11, the second pixel circuit PC2 and the third pixel circuit PC3 are arranged in the component area CA. However, in an embodiment, the second pixel circuit PC2 and/or the third pixel circuit PC3 may be arranged in the main area MA. This will be described later with reference to FIGS. 13 through 15.

The first pixel circuit PC1 and the first display element DE1 may at least partially overlap each other, and the second pixel circuit PC2 and the second display element DE2 may at least partially overlap each other. The third pixel circuit PC3 and the third display element DE3 may not overlap each other.

Referring to FIG. 12, the third pixel circuit PC3 may be arranged on the first surface 100a of the substrate 100, and the third display element DE3 may be arranged on the second surface 100b of the substrate 100. The third display element DE3 may be connected to the third pixel circuit PC3. For example, as shown in FIG. 12, the third display element DE3 may be connected to the third pixel circuit PC3 through the first pad electrode PE1, the first through electrode TE1, and the connection line CL.

The third pixel circuit PC3 may include at least one transistor and a storage capacitor, as shown in FIG. 3 described above. For example, the third pixel circuit PC3 may include a third driving transistor that controls a current flowing through the third display element DE3. The at least one transistor may be formed as a thin-film transistor.

In an embodiment, a ratio of a width of a channel of a third driving transistor of the third pixel circuit PC3 with respect to a length of the channel of the third driving transistor of the third pixel circuit PC3 may be less than a ratio of a width of a channel of a second driving transistor of the second pixel circuit PC2 with respect to a length of the channel of the second driving transistor of the second pixel circuit PC2.

When a current flowing through each of an inorganic light emitting diode and an organic light emitting diode is controlled by the same driving transistor, the inorganic light emitting diode may emit light having larger luminance than that of the organic light emitting diode by the kink effect.

According to an embodiment of the present disclosure, a third driving transistor controlling a current flowing through the third display element DE3 that may be formed as an inorganic light emitting diode, and a second driving transistor controlling a current flowing through the second display element DE2 that may be formed as an organic light emitting diode may have different structures. A ratio of a width of a channel of the third driving transistor with respect to a length of the channel of the third driving transistor may be less than a ratio of a width of a channel of the second driving transistor with respect to a length of the channel of the second driving transistor. In this case, the luminance of the third display element DE3 that is an inorganic light emitting diode and the luminance of the second display element DE2 that is an organic light emitting diode may be substantially the same as each other.

Figure 13:
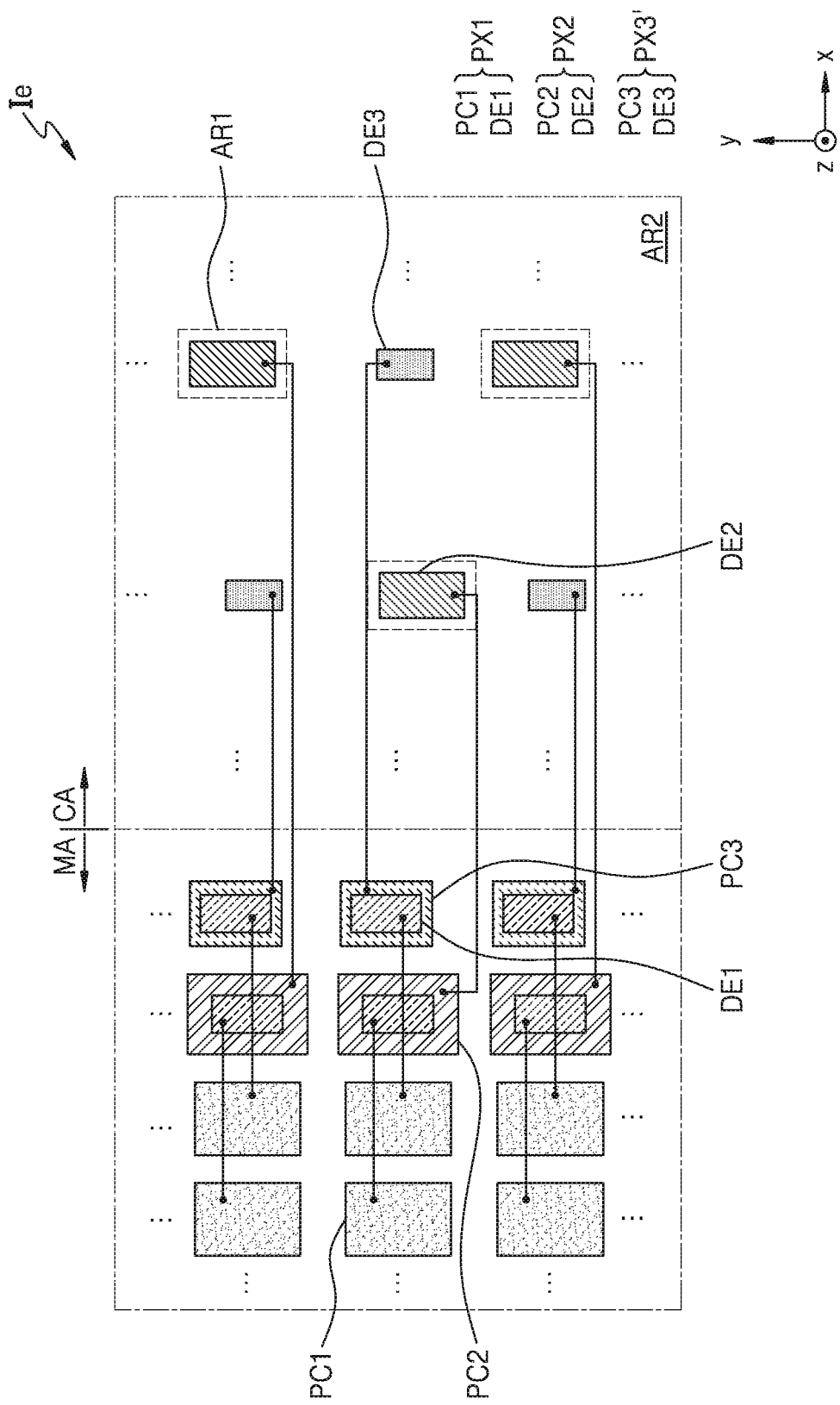
FIG. 13 is an enlarged plan view illustrating some of FIG. 4 according to an embodiment of the present inventive concept.
Figure 14:
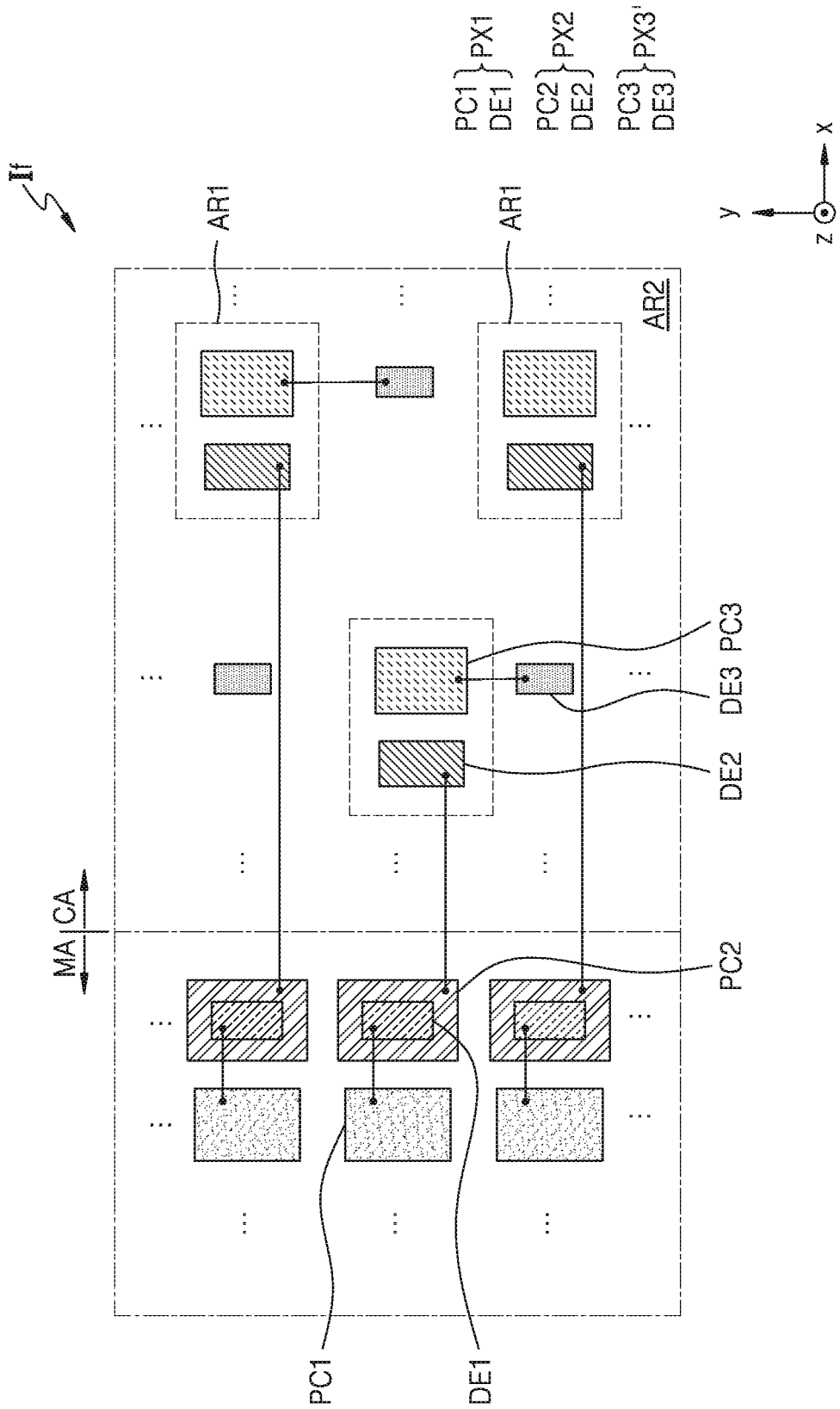
FIG. 14 is an enlarged plan view illustrating some of FIG. 4 according to an embodiment of the present inventive concept.
Figure 15:
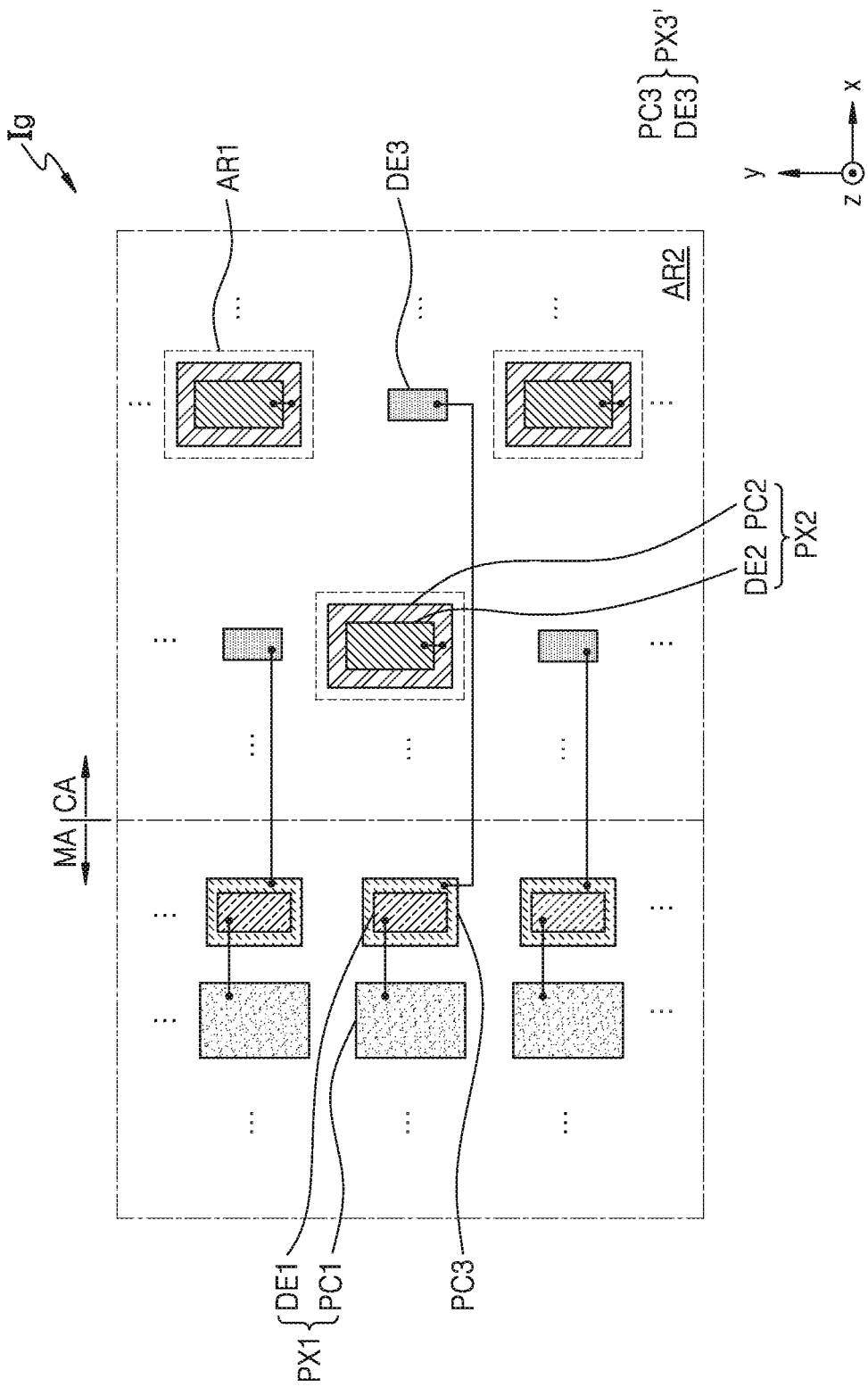
FIG. 15 is an enlarged plan view illustrating some of FIG. 4 according to an embodiment of the present inventive concept.

FIGS. 13 through 15 are enlarged plan views illustrating some of FIG. 4. FIGS. 13 through 15 illustrate modified embodiments of FIG. 11, and there is a difference in a second pixel circuit and a third pixel circuit. Hereinafter, redundant contents of the description of FIG. 11 will be omitted, and differences will be mainly described.

First, referring to FIG. 13, unlike in FIG. 11 described above, the second pixel circuit PC2 and the third pixel circuit PC3 may be arranged in the main area MA. The second pixel circuit PC2 and the second display element DE2 may not overlap each other, and the third pixel circuit PC3 and the third display element DE3 may not overlap each other.

In an embodiment, the first pixel circuit PC1 and the first display element DE1 may at least partially overlap each other or may not overlap each other according to a position in which the first pixel circuit PC1 and the first display element DE1 are arranged in the main area MA. For example, as shown in FIG. 13, the first pixel circuit PC1 that are adjacent to the second pixel circuit PC2 and the third pixel circuit PC3 may not overlap the first display element DE1 connected to the first pixel circuit PC1. The first display element DE1 may at least partially overlap the second pixel circuit PC2 and/or the third pixel circuit PC3.

Although not shown in FIG. 13, the area in which the first pixel circuit PC1 and the first display element DE1 overlap each other, may vary according to a separation distance between the first pixel circuit PC1 and the component area CA. When the separation distance between the first pixel circuit PC1 and the component area CA is relatively large, the area in which the first pixel circuit PC1 and the first display element DE1 overlap each other, may be relatively large. For example, as the position of the first pixel circuit PC1 is away from the component area CA, the area in which the first pixel circuit PC1 and the first display element DE1 overlap each other, may increase.

In an embodiment, as shown in FIG. 14, the second pixel circuit PC2 may be arranged in the main area MA, and the third pixel circuit PC3 may be arranged in the component area CA.

In FIG. 14, the third display element DE3 is connected to the third pixel circuit PC3 arranged in the same column as that of the third display element DE3. However, in an embodiment, the third display element DE3 may be connected to the third pixel circuit PC3 arranged in the same row as that of the third display element DE3.

In an embodiment, as shown in FIG. 15, the second pixel circuit PC2 may be arranged in the component area CA, and the third pixel circuit PC3 may be arranged in the main area MA.

Until now, a display panel and a display apparatus have been mainly described, but the present disclosure is not limited thereto. For example, it will be understood that a method of manufacturing the display panel and a method of manufacturing the display apparatus also fall within the scope of the present disclosure.

According to an embodiment of the present disclosure as described above, a display element is arranged under a region of a substrate on which a component is arranged, so that a display panel may have an enhanced resolution at the region on which the component is arranged, and a display apparatus including the same may be implemented. The scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate having a first surface and a second surface opposite to the first surface;
   a first pixel circuit arranged on the first surface of the substrate;
   a first pad electrode arranged on the second surface of the substrate;

a first through electrode passing through the substrate and connecting the first pixel circuit to the first pad electrode;
a plurality of display elements sharing a common electrode arranged on the first surface of the substrate and arranged on the first pixel circuit;
a second pad electrode arranged on the second surface of the substrate; and
a second through electrode passing through the substrate and connecting the common electrode to the second pad electrode,
wherein the plurality of display elements include a first display element arranged on the first surface of the substrate and being connected to the first pixel circuit, and
wherein the first pixel circuit and an emission layer of the first display element at least partially overlap each other in a vertical direction perpendicular to the first surface of the substrate.

2. The display panel of claim 1, further comprising:
a second pixel circuit arranged on the first surface of the substrate,
wherein the plurality of display elements include a second display element arranged on the first surface of the substrate and being connected to the second pixel circuit,
wherein:
a component area and a main area surrounding at least a portion of the component area are defined in the substrate,
the first pixel circuit is arranged in the component area,
the first display element, the first pad electrode, and the second pad electrode are arranged in the component area, and
the second pixel circuit and the second display element are arranged in the main area, and
wherein the second pixel circuit and the second display element at least partially overlap each other.

3. The display panel of claim 1, further comprising:
a second pixel circuit arranged on the first surface of the substrate; and
a second display element arranged on the first surface of the substrate and being connected to the second pixel circuit,
wherein the first pixel circuit comprises:
a first driving transistor configured to control a current flowing through the first pad electrode;
a first scan transistor configured to transmit a first data voltage to the first driving transistor in response to a first scan signal; and
a first storage capacitor having a first electrode and a second electrode connected to a gate of the first driving transistor, and
wherein the second pixel circuit comprises:
a second driving transistor configured to control a current flowing through the second display element;
a second scan transistor configured to transmit a second data voltage to the second driving transistor in response to a second scan signal; and
a second storage capacitor having a third electrode and a fourth electrode connected to a gate of the second driving transistor.

4. The display panel of claim 3,
wherein a ratio of a width of a channel of the first driving transistor with respect to a length of the channel of the first driving transistor is less than a ratio of a width of a channel of the second driving transistor with respect to a length of the channel of the second driving transistor.

5. The display panel of claim 1, further comprising:
a connection line extending in a first direction and configured to connect the first through electrode to the first pixel circuit.

6. A display apparatus comprising:
a substrate having a first surface and a second surface opposite to the first surface;
a first pixel circuit arranged on the first surface of the substrate;
a first through electrode passing through the substrate and being connected to the first pixel circuit;
a first pad electrode arranged on the second surface of the substrate and being connected to the first through electrode;
a plurality of display elements including a first display element arranged on the second surface of the substrate and being connected to the first pad electrode; and
an image capturing device arranged on the second surface of the substrate,
wherein the first display element is arranged between the substrate and the image capturing device.

7. The display apparatus of claim 6,
wherein the plurality of display elements share a common electrode arranged on the first surface of the substrate, and
wherein the first display element is connected to the common electrode.

8. The display apparatus of claim 7, further comprising:
a second through electrode passing through the substrate and connecting the first display element to the common electrode; and
a second pad electrode arranged on the second surface of the substrate and being connected to the second through electrode,
wherein the first display element comprises a first conductive pad electrode connected to the first pad electrode, and a second conductive pad electrode connected to the second pad electrode.

9. The display apparatus of claim 6,
wherein the plurality of display elements include a second display element arranged on the first surface of the substrate and being connected to the first pixel circuit.

10. The display apparatus of claim 9,
wherein the first display element comprises a first emission layer of an inorganic material, and
wherein the second display element comprises a second emission layer of an organic material.

11. The display apparatus of claim 9,
wherein an emission area of the first display element is less than an emission area of the second display element.

12. The display apparatus of claim 9,
wherein the first display element and the second display element are alternately and repetitively arranged in a first direction.

13. The display apparatus of claim 6, further comprising:
a second pixel circuit arranged on the first surface of the substrate,
wherein the plurality of display elements include a second display element arranged on the first surface of the substrate and being connected to the second pixel circuit, wherein the first pixel circuit comprises:
- a first driving transistor configured to control a current flowing through the first display element;
- a first scan transistor configured to transmit a first data voltage to the first driving transistor in response to a first scan signal; and
- a first storage capacitor having a first electrode and a second electrode connected to a gate of the first driving transistor, and wherein the second pixel circuit comprises:
- a second driving transistor configured to control a current flowing through the second display element;
- a second scan transistor configured to transmit a second data voltage to the second driving transistor in response to a second scan signal; and
- a second storage capacitor having a third electrode and a fourth electrode connected to a gate of the second driving transistor.

14. The display apparatus of claim 13, wherein a ratio of a width of a channel of the first driving transistor with respect to a length of the channel of the first driving transistor is less than a ratio of a width of a channel of the second driving transistor with respect to a length of the channel of the second driving transistor.

15. The display apparatus of claim 13, wherein the first display element comprises a first emission layer of an inorganic material, and wherein the second display element comprises a second emission layer of an organic material.

16. The display apparatus of claim 13, wherein an emission area of the first display element is less than an emission area of the second display element.

17. The display apparatus of claim 6, wherein, when the display apparatus is viewed in a plan view, the first display element and the first pixel circuit are spaced apart from each other.

18. A display panel comprising:
- a substrate having a first surface and a second surface opposite to the first surface;
- a first pixel circuit arranged on the first surface of the substrate;
- a first pad electrode arranged on the second surface of the substrate;
- a first through electrode passing through the substrate and connecting the first pixel circuit to the first pad electrode;
- a plurality of display elements sharing a common electrode arranged on the first surface of the substrate and arranged on the first pixel circuit;
- a second pad electrode arranged on the second surface of the substrate;
- a second through electrode passing through the substrate and connecting the common electrode to the second pad electrode; and
- a second pixel circuit arranged on the first surface of the substrate, wherein the plurality of display elements include a first display element arranged on the first surface of the substrate and being connected to the first pixel circuit, and a second display element arranged on the first surface of the substrate and being connected to the second pixel circuit, and wherein the first pixel circuit and an emission layer of the second display element at least partially overlap each other in a vertical direction perpendicular to the first surface of the substrate.

19. The display panel of claim 18, wherein:
- a component area and a main area surrounding at least a portion of the component area are defined in the substrate,
- the first pixel circuit is arranged in the main area,
- the first display element, the first pad electrode, and the second pad electrode are arranged in the component area, and
- the second display element is arranged in the main area.

* * * * *